(12) United States Patent
Kanno et al.

(10) Patent No.: US 8,021,763 B2
(45) Date of Patent: Sep. 20, 2011

(54) PHOSPHORESCENT OLED WITH INTERLAYER

(75) Inventors: Hiroshi Kanno, West Windsor, NJ (US); Stephen Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 916 days.

(21) Appl. No.: 11/285,059

(22) Filed: Nov. 23, 2005

(65) Prior Publication Data
US 2007/0116983 A1 May 24, 2007

(51) Int. Cl.
*H01L 51/54* (2006.01)
(52) U.S. Cl. ........ 428/690; 428/917; 313/504; 313/506; 257/40; 257/88; 257/89; 257/101; 257/102; 257/103; 257/E51.022; 257/E51.044
(58) Field of Classification Search .......... 428/690, 428/917; 313/504, 506; 257/40, E51.044
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |
| 6,303,238 B1 | 10/2001 | Thompson et al. | |
| 6,310,360 B1 | 10/2001 | Forrest et al. | |
| 6,337,102 B1 | 1/2002 | Forrest et al. | |
| 6,468,819 B1 | 10/2002 | Kim et al. | |
| 6,548,956 B2 | 4/2003 | Forrest et al. | |
| 6,576,134 B1 | 6/2003 | Agner et al. | |
| 6,602,540 B2 | 8/2003 | Gu et al. | |
| 2002/0034656 A1 | 3/2002 | Thompson et al. | |
| 2002/0055015 A1* | 5/2002 | Sato et al. ............... | 428/690 |
| 2002/0182441 A1 | 12/2002 | Lamansky et al. | |
| 2003/0068528 A1 | 4/2003 | Thompson et al. | |
| 2003/0072964 A1 | 4/2003 | Kwong et al. | |
| 2003/0175553 A1* | 9/2003 | Thompson et al. ........ | 428/690 |
| 2003/0230980 A1 | 12/2003 | Forrest et al. | |
| 2004/0174116 A1 | 9/2004 | Lu et al. | |
| 2005/0029933 A1 | 2/2005 | Liao et al. | |
| 2005/0110398 A1* | 5/2005 | Lee ........................... | 313/504 |
| 2005/0164033 A1* | 7/2005 | Chin et al. ............... | 428/690 |
| 2005/0173700 A1* | 8/2005 | Liao et al. ............... | 257/40 |
| 2005/0264174 A1* | 12/2005 | Liao et al. ............... | 313/500 |

FOREIGN PATENT DOCUMENTS

| | | |
|---|---|---|
| WO | WO 02/074015 | 9/2002 |
| WO | WO 2004/085450 A2 * | 10/2004 |

OTHER PUBLICATIONS

U.S. Appl. No. 10/233,470, filed Sep. 4, 2002, Shtein et al.
M. A. Baldo et al., "Highly efficient phosphorescent emission from organic electroluminescent devices," *Nature*, vol. 395, pp. 151-154. (1998).

(Continued)

*Primary Examiner* — Callie Shosho
*Assistant Examiner* — Michael H Wilson
(74) *Attorney, Agent, or Firm* — Kenyon & Kenyon LLP

(57) ABSTRACT

The present invention relates to phosphorescent stacked OLEDs having an interlayer.

19 Claims, 18 Drawing Sheets

OTHER PUBLICATIONS

M.A. Baldo et al., "Very high-efficiency green organic light-emitting devices based on electrophosphorescence", *Applied Physics Letters*, vol. 75, No. 1, pp. 4-6 (1999).

C. Adachi et al., "Nearly 100% Internal Phosphorescence Efficiency in an Organic Light Emitting Device", *J. Appl. Phys.*, vol. 90, No. 10, pp. 5048-5051 (2001).

Matsumoto et al., "Multiphoton Organic EL device having Charge Generation Layer", International Manufacturing and Engineering Services (IMES) Co. Ltd., 413-414.

Liao et al., "High-efficiency tandem organic light-emitting diodes" (Attachment C to PRIN-36101 disclosure), Applied Physics Lett. 84(2)167-169.

Matsumoto et al., "High Efficiency Organic EL Devices having Charge Generation Layers", IMES Co., SID 03 Digest, 964-5.

Holmes et al., 2003, "Efficient, deep-blue organic electrophosphorescence by guest charge trapping", Appl. Phys. Lett. 83(18):3818-3820.

Sajoto et al., 2005, "Recent progress in blue phosphorescent iridium(III) complexes and their application to organic light emitting devices (OLEDS)", Abstracts of Papers, 229th ACS National Meeting, San Diego, CA, United States, Mar. 13-17, 2005, INOR-455, American Chemical Society: Washington, D.C.

CAS Registry for 664374-03-2 on STN.

* cited by examiner

PHOSPHORESCENT OLED WITH INTERLAYER

JOINT RESEARCH AGREEMENT

The claimed invention was made by, on behalf of, and/or in connection with one or more of the following parties to a joint university corporation research agreement: Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices (OLEDs), and more specifically to phosphorescent OLED devices having a reflective layer.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules. In general, a small molecule has a well-defined chemical formula with a single molecular weight, whereas a polymer has a chemical formula and a molecular weight that may vary from molecule to molecule. As used herein, "organic" includes metal complexes of hydrocarbyl and heteroatom-substituted hydrocarbyl ligands.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic optoelectronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

SUMMARY OF THE INVENTION

The present invention relates to phosphorescent OLEDs having an interlayer. The interlayer may be a layer in a stacked device. The device may further include ways of confining charge carriers and/or excitons to emissive layers. Preferred ways of confining include blocking layers and the use of materials having energy levels conducive to direct trapping.

A phosphorescent OLED according to the invention comprises an anode, a first phosphorescent unit, an interlayer, a second phosphorescent unit, and a cathode. Each phosphorescent unit may further comprise an organic emissive layer disposed between blocking layers. When a voltage is applied to the device, the interlayer may inject electrons into the first phosphorescent unit and holes into the second phosphorescent unit. When these charge carriers combine with charge carriers being injected by the electrodes, the phosphorescent units produce electromagnetic radiation as previously described. In preferred embodiments, the radiation produced will be visible light, with white light being particularly preferred.

A stacked phosphorescent OLED may further comprise blocking layers. The device comprises an anode, a first phosphorescent unit, an interlayer, a second phosphorescent unit, and a cathode as described above. Each phosphorescent unit may further comprise various blocking layers. For example, hole or electron blocking layers may be present. Such blocking layers may confine charge carriers within recombination zones, to increase efficiency of the device. In preferred embodiments, the phosphorescent units comprise exciton blocking layers.

A preferred way of confining charge carriers and/or excitons to emissive layers is the use of materials having energy levels conducive to direct trapping. By way of non-limiting example, such configurations include the use of an emissive dopant having a HOMO that is at least 0.3 eV higher than the HOMO of the host material. Another such configuration has an emissive dopant having a LUMO that is at least 0.3 eV lower than the LUMO of the host material.

Devices according to the present invention may efficiently produce bright, white light. In preferred embodiments, light with a CIE in a range of about (0.33±0.10, 0.33±0.10) and a CRI of at least about 75 may be produced. It is preferred if the device has an efficiency of at least about 10 lm/W, with at least about 20 lm/W being particularly preferred.

DETAILED DESCRIPTION

Figure 1:
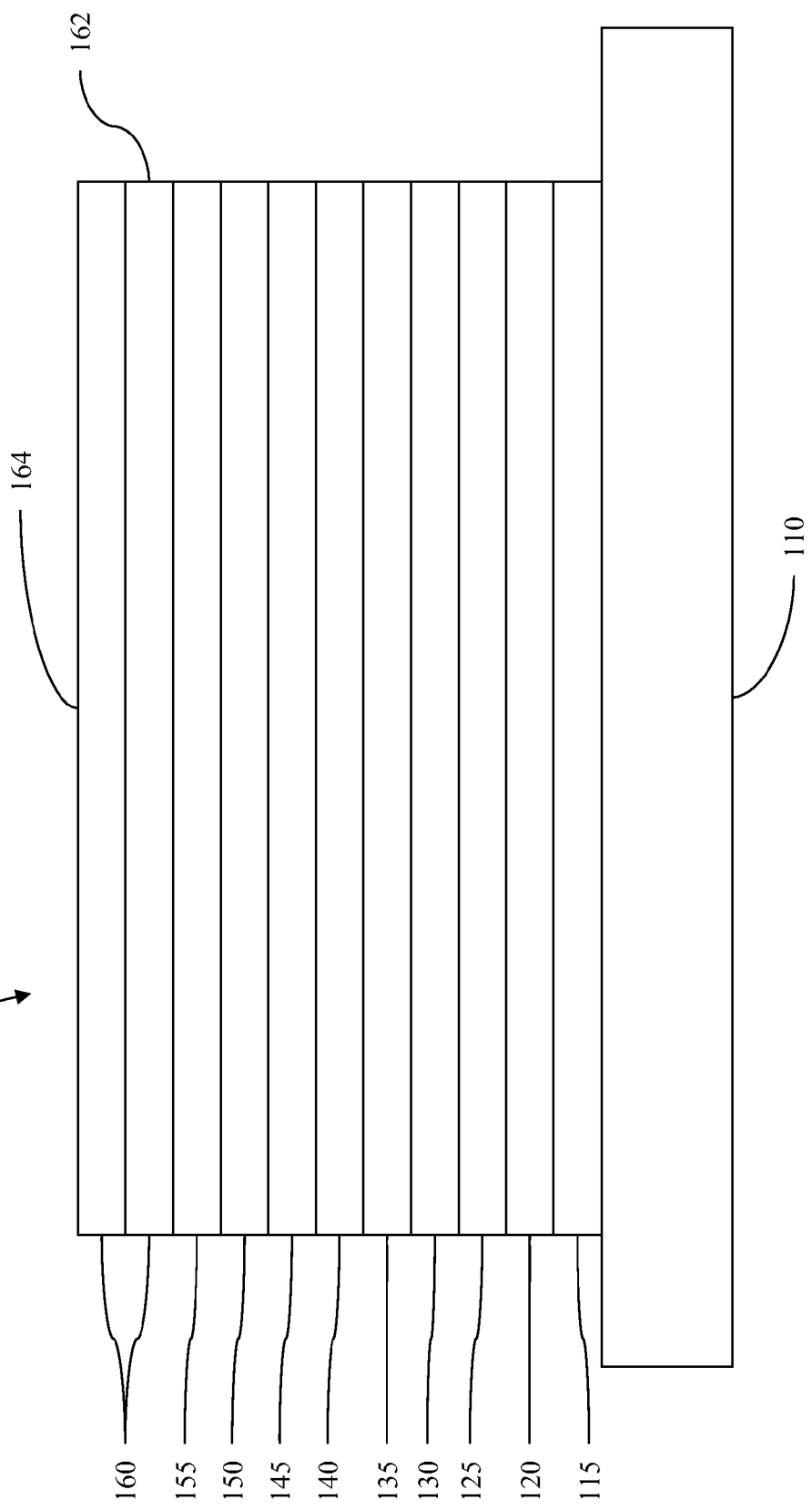
FIG. 1 shows an organic light emitting device having separate electron transport, hole transport, and emissive layers, as well as other layers.

Generally, an OLED comprises at least one organic layer disposed between and electrically connected to an anode and a cathode. For purposes of this application, two layers are said to be electrically connected if they are connected within the device, possibly through intervening layers. A layer that is directly externally connected to, for example, a voltage, is said to be an electrode. Generally, anodes and cathodes are electrodes. However, a layer may be an anode or a cathode without having a direct external connection. When a current is applied, the anode injects holes and the cathode injects electrons into the organic layer(s). A layer that injects charge carriers but does not have a direct external connection may be referred to as an interlayer. The term "charge generation layer" may also be used. The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 1, 4-6 (1999) ("Baldo-II"), which are incorporated by reference in their entireties. Phosphorescence may be referred to as a "forbidden" transition because the transition requires a change in spin states, and quantum mechanics indicates that such a transition is not favored. As a result, phosphorescence generally occurs in a time frame exceeding at least 10 nanoseconds, and typically greater than 100 nanoseconds. If the natural radiative lifetime of phosphorescence is too long, triplets may decay by a non-radiative mechanism, such that no light is emitted. Organic phosphorescence is also often observed in molecules containing heteroatoms with unshared pairs of electrons at very low temperatures. 2,2'-bipyridine is such a molecule. Non-radiative decay mechanisms are typically temperature dependent, such that an organic material that exhibits phosphorescence at liquid nitrogen temperatures typically does not exhibit phosphorescence at room temperature. But, as demonstrated by Baldo, this problem may be addressed by selecting phosphorescent compounds that do phosphoresce at room temperature. Representative emissive layers include doped or un-doped phosphorescent organometallic materials such as disclosed in U.S. Pat. Nos. 6,303,238 and 6,310,360; U.S. Patent Application Publication Nos. 2002-0034656; 2002-0182441; 2003-0072964; and WO-02/074015.

Generally, the excitons in an OLED are believed to be created in a ratio of about 3:1, i.e., approximately 75% triplets and 25% singlets. See, Adachi et al., "Nearly 100% Internal Phosphorescent Efficiency In An Organic Light Emitting Device," J. Appl. Phys., 90, 5048 (2001), which is incorporated by reference in its entirety. In many cases, singlet excitons may readily transfer their energy to triplet excited states via "intersystem crossing," whereas triplet excitons may not readily transfer their energy to singlet excited states. As a result, 100% internal quantum efficiency is theoretically possible with phosphorescent OLEDs. In a fluorescent device, the energy of triplet excitons is generally lost to radiationless decay processes that heat-up the device, resulting in much lower internal quantum efficiencies. OLEDs utilizing phosphorescent materials that emit from triplet excited states are disclosed, for example, in U.S. Pat. No. 6,303,238, which is incorporated by reference in its entirety.

Phosphorescence may be preceded by a transition from a triplet excited state to an intermediate non-triplet state from which the emissive decay occurs. For example, organic molecules coordinated to lanthanide elements often phosphoresce from excited states localized on the lanthanide metal. However, such materials do not phosphoresce directly from a triplet excited state but instead emit from an atomic excited state centered on the lanthanide metal ion. The europium diketonate complexes illustrate one group of these types of species.

Phosphorescence from triplets can be enhanced over fluorescence by confining, preferably through bonding, the organic molecule in close proximity to an atom of high atomic number. This phenomenon, called the heavy atom effect, is created by a mechanism known as spin-orbit coupling. Such a phosphorescent transition may be observed from an excited metal-to-ligand charge transfer (MLCT) state of an organometallic molecule such as tris(2-phenylpyridine)iridium(III).

As used herein, the term "triplet energy" refers to an energy corresponding to the highest energy feature discernable in the phosphorescence spectrum of a given material. The highest energy feature is not necessarily the peak having the greatest intensity in the phosphorescence spectrum, and could, for example, be a local maximum of a clear shoulder on the high energy side of such a peak.

The term "organometallic" as used herein is as generally understood by one of ordinary skill in the art and as given, for example, in "Inorganic Chemistry" (2nd Edition) by Gary L. Miessler and Donald A. Tarr, Prentice Hall (1998). Thus, the term organometallic refers to compounds which have an organic group bonded to a metal through a carbon-metal bond. This class does not include per se coordination compounds, which are substances having only donor bonds from heteroatoms, such as metal complexes of amines, halides, pseudohalides (CN, etc.), and the like. In practice organometallic compounds generally comprise, in addition to one or more carbon-metal bonds to an organic species, one or more donor bonds from a heteroatom. The carbon-metal bond to an organic species refers to a direct bond between a metal and a carbon atom of an organic group, such as phenyl, alkyl, alkenyl, etc., but does not refer to a metal bond to an "inorganic carbon," such as the carbon of CN or CO.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order.

Substrate 110 may be any suitable substrate that provides desired structural properties. Substrate 110 may be flexible or rigid. Substrate 110 may be transparent, translucent or opaque. Plastic and glass are examples of preferred rigid substrate materials. Plastic and metal foils are examples of preferred flexible substrate materials. Substrate 110 may be a semiconductor material in order to facilitate the fabrication of circuitry. For example, substrate 110 may be a silicon wafer upon which circuits are fabricated, capable of controlling OLEDs subsequently deposited on the substrate. Other substrates may be used. The material and thickness of substrate 110 may be chosen to obtain desired structural and optical properties.

Anode 115 may be any suitable anode that is sufficiently conductive to transport holes to the organic layers. The material of anode 115 preferably has a work function higher than about 4 eV (a "high work function material"). Preferred anode materials include conductive metal oxides, such as indium tin oxide (ITO) and indium zinc oxide (IZO), aluminum zinc oxide (AlZnO), and metals. Anode 115 (and substrate 110) may be sufficiently transparent to create a bottom-emitting device. A preferred transparent substrate and anode combination is commercially available ITO (anode) deposited on glass or plastic (substrate). A flexible and transparent substrate-anode combination is disclosed in U.S. Pat. Nos. 5,844,363 and 6,602,540 B2, which are incorporated by reference in their entireties. Anode 115 may be opaque and/or reflective. A reflective anode 115 may be preferred for some top-emitting devices, to increase the amount of light emitted from the top of the device. The material and thickness of anode 115 may be chosen to obtain desired conductive and optical properties. Where anode 115 is transparent, there may be a range of thickness for a particular material that is thick enough to provide the desired conductivity, yet thin enough to provide the desired degree of transparency. Other anode materials and structures may be used.

Hole transport layer 125 may include a material capable of transporting holes. Hole transport layer 130 may be intrinsic (undoped), or doped. Doping may be used to enhance conductivity. α-NPD and TPD are examples of intrinsic hole transport layers. An example of a p-doped hole transport layer is m-MTDATA doped with $F_4$-TCNQ at a molar ratio of 50:1, as disclosed in U.S. Patent Application Publication No. 2003-0230980 to Forrest et al., which is incorporated by reference in its entirety. Other hole transport layers may be used.

Emissive layer 135 may include an organic material capable of emitting light when a current is passed between anode 115 and cathode 160. Preferably, emissive layer 135 contains a phosphorescent emissive material, although fluorescent emissive materials may also be used. Phosphorescent materials are preferred because of the higher luminescent efficiencies associated with such materials. Emissive layer 135 may also comprise a host material capable of transporting electrons and/or holes, doped with an emissive material that may trap electrons, holes, and/or excitons, such that excitons relax from the emissive material via a photoemissive mechanism. Emissive layer 135 may comprise a single material that combines transport and emissive properties. Whether the emissive material is a dopant or a major constituent, emissive layer 135 may comprise other materials, such as dopants that tune the emission of the emissive material. Emissive layer 135 may include a plurality of emissive materials capable of, in combination, emitting a desired spectrum of light. Examples of phosphorescent emissive materials include Ir(ppy)$_3$. Examples of fluorescent emissive materials include DCM and DMQA. Examples of host materials include Alq$_3$, CBP and mCP. Examples of emissive and host materials are disclosed in U.S. Pat. No. 6,303,238 to Thompson et al., which is incorporated by reference in its entirety. Emissive material may be included in emissive layer 135 in a number of ways. For example, an emissive small molecule may be incorporated into a polymer. This may be accomplished by several ways: by doping the small molecule into the polymer either as a separate and distinct molecular species; or by incorporating the small molecule into the backbone of the polymer, so as to form a co-polymer; or by bonding the small molecule as a pendant group on the polymer. Other emissive layer materials and structures may be used. For example, a small molecule emissive material may be present as the core of a dendrimer.

Many useful emissive materials include one or more ligands bound to a metal center. A ligand may be referred to as "photoactive" if it contributes directly to the photoactive properties of an organometallic emissive material. A "photoactive" ligand may provide, in conjunction with a metal, the energy levels from which and to which an electron moves when a photon is emitted. Other ligands may be referred to as "ancillary." Ancillary ligands may modify the photoactive properties of the molecule, for example by shifting the energy levels of a photoactive ligand, but ancillary ligands do not directly provide the energy levels involved in light emission. A ligand that is photoactive in one molecule may be ancillary in another. These definitions of photoactive and ancillary are intended as non-limiting theories.

Electron transport layer 145 may include a material capable of transporting electrons. Electron transport layer 145 may be intrinsic (undoped), or doped. Doping may be used to enhance conductivity. Alq$_3$ is an example of an intrinsic electron transport layer. An example of an n-doped electron transport layer is BPhen doped with Li at a molar ratio of 1:1, as disclosed in U.S. Patent Application Publication No. 2003-0230980 to Forrest et al., which is incorporated by reference in its entirety. Other electron transport layers may be used.

The charge carrying component of the electron transport layer may be selected such that electrons can be efficiently injected from the cathode into the LUMO (Lowest Unoccupied Molecular Orbital) energy level of the electron transport layer. The "charge carrying component" is the material responsible for the LUMO energy level that actually transports electrons. This component may be the base material, or it may be a dopant. The LUMO energy level of an organic material may be generally characterized by the electron affinity of that material and the relative electron injection efficiency of a cathode may be generally characterized in terms of the work function of the cathode material. This means that the preferred properties of an electron transport layer and the adjacent cathode may be specified in terms of the electron affinity of the charge carrying component of the ETL and the work function of the cathode material. In particular, so as to achieve high electron injection efficiency, the work function of the cathode material is preferably not greater than the electron affinity of the charge carrying component of the electron transport layer by more than about 0.75 eV, more preferably, by not more than about 0.5 eV. Similar considerations apply to any layer into which electrons are being injected.

Cathode 160 may be any suitable material or combination of materials known to the art, such that cathode 160 is capable of conducting electrons and injecting them into the organic layers of device 100. Cathode 160 may be transparent or opaque, and may be reflective. Metals and metal oxides are examples of suitable cathode materials. Cathode 160 may be a single layer, or may have a compound structure. FIG. 1 shows a compound cathode 160 having a thin metal layer 162 and a thicker conductive metal oxide layer 164. In a compound cathode, preferred materials for the thicker layer 164 include ITO, IZO, and other materials known to the art. U.S. Pat. Nos. 5,703,436, 5,707,745, 6,548,956 B2 and 6,576,134 B2, which are incorporated by reference in their entireties, disclose examples of cathodes including compound cathodes having a thin layer of metal such as Mg:Ag with an overlying transparent, electrically-conductive, sputter-deposited ITO layer. The part of cathode 160 that is in contact with the underlying organic layer, whether it is a single layer cathode 160, the thin metal layer 162 of a compound cathode, or some other part, is preferably made of a material having a work function lower than about 4 eV (a "low work function material"). Other cathode materials and structures may be used.

Blocking layers may be used to reduce the number of charge carriers (electrons or holes) and/or excitons that leave the emissive layer. An electron blocking layer 130 may be disposed between emissive layer 135 and the hole transport layer 125, to block electrons from leaving emissive layer 135 in the direction of hole transport layer 125. Similarly, a hole blocking layer 140 may be disposed between emissive layer 135 and electron trasport layer 145, to block holes from leaving emissive layer 135 in the direction of electron transport layer 145. Blocking layers may also be used to block excitons from diffusing out of the emissive layer. The theory and use of blocking layers is described in more detail in U.S. Pat. No. 6,097,147 and U.S. Patent Application Publication No. 2003-0230980 to Forrest et al., which are incorporated by reference in their entireties.

As used herein, and as would be understood by one skilled in the art, the term "blocking layer" means that the layer provides a barrier that significantly inhibits transport of charge carriers and/or excitons through the device, without suggesting that the layer necessarily completely blocks the charge carriers and/or excitons. The presence of such a blocking layer in a device may result in substantially higher efficiencies as compared to a similar device lacking a blocking layer. Also, a blocking layer may be used to confine emission to a desired region of an OLED.

Generally, injection layers are comprised of a material that may improve the injection of charge carriers from one layer, such as an electrode or an organic layer into an adjacent organic layer. Injection layers may also perform a charge transport function. In device 100, hole injection layer 120 may be any layer that improves the injection of holes from anode 115 into hole transport layer 125. CuPc is an example of a material that may be used as a hole injection layer from an ITO anode 115, and other anodes. In device 100, electron injection layer 150 may be any layer that improves the injection of electrons into electron transport layer 145. LiF/Al is an example of a material that may be used as an electron injection layer into an electron transport layer from an adjacent layer. Other materials or combinations of materials may be used for injection layers. Depending upon the configuration of a particular device, injection layers may be disposed at locations different than those shown in device 100. More examples of injection layers are provided in U.S. Pat. No. 7,071,615, which is incorporated by reference in its entirety. A hole injection layer may comprise a solution deposited material, such as a spin-coated polymer, e.g., PEDOT:PSS, or it may be a vapor deposited small molecule material, e.g., CuPc or MTDATA.

A hole injection layer (HIL) may planarize or wet the anode surface so as to provide efficient hole injection from the anode into the hole injecting material. A hole injection layer may also have a charge carrying component having HOMO (Highest Occupied Molecular Orbital) energy levels that favorably match up, as defined by their herein-described relative ionization potential (IP) energies, with the adjacent anode layer on one side of the HIL and the hole transporting layer on the opposite side of the HIL. The "charge carrying component" is the material responsible for the HOMO energy level that actually transports holes. This component may be the base material of the HIL, or it may be a dopant. Using a doped HIL allows the dopant to be selected for its electrical properties, and the host to be selected for morphological properties such as wetting, flexibility, toughness, etc. Preferred properties for the HIL material are such that holes can be efficiently injected from the anode into the HIL material. In particular, the charge carrying component of the HIL preferably has an IP not more than about 0.7 eV greater that the IP of the anode material. More preferably, the charge carrying component has an IP not more than about 0.5 eV greater than the anode material. Similar considerations apply to any layer into which holes are being injected. HIL materials are further distinguished from conventional hole transporting materials that are typically used in the hole transporting layer of an OLED in that such HIL materials may have a hole conductivity that is substantially less than the hole conductivity of conventional hole transporting materials. The thickness of the HIL of the present invention may be thick enough to help planarize or wet the surface of the anode layer. For example, an HIL thickness of as little as 10 nm may be acceptable for a very smooth anode surface. However, since anode surfaces tend to be very rough, a thickness for the HIL of up to 50 nm may be desired in some cases.

A protective layer may be used to protect underlying layers during subsequent fabrication processes. For example, the processes used to fabricate metal or metal oxide top electrodes may damage organic layers, and a protective layer may be used to reduce or eliminate such damage. In device 100, protective layer 155 may reduce damage to underlying organic layers during the fabrication of cathode 160. Preferably, a protective layer has a high carrier mobility for the type of carrier that it transports (electrons in device 100), such that it does not significantly increase the operating voltage of device 100. CuPc, BCP, and various metal phthalocyanines are examples of materials that may be used in protective layers. Other materials or combinations of materials may be used. The thickness of protective layer 155 is preferably thick enough that there is little or no damage to underlying layers due to fabrication processes that occur after organic protective layer 160 is deposited, yet not so thick as to significantly increase the operating voltage of device 100. Protective layer 155 may be doped to increase its conductivity. For example, a CuPc or BCP protective layer 160 may be doped With Li. A more detailed description of protective layers may be found in U.S. Pat. No. 7,071,615, which is incorporated by reference in its entirety.

Figure 2:
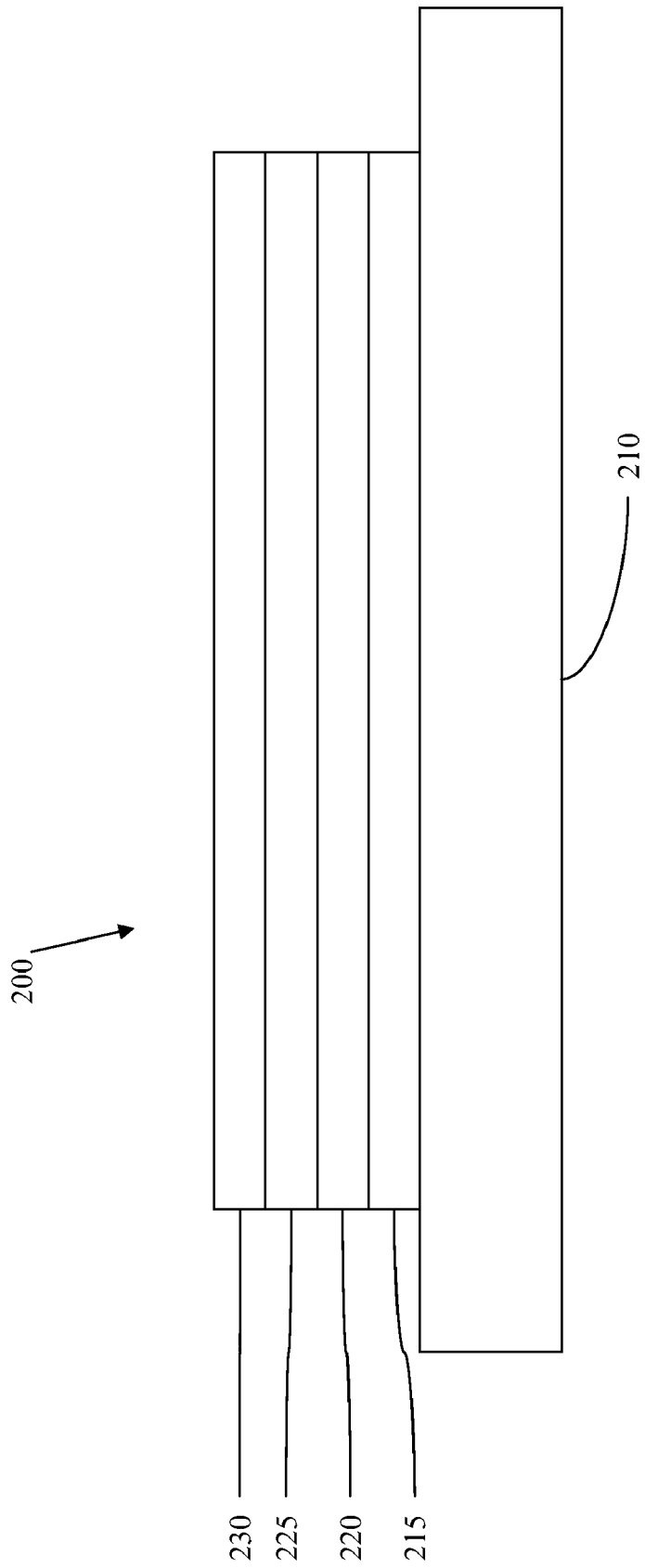
FIG. 2 shows an inverted organic light emitting device that does not have a separate electron transport layer.

FIG. 2 shows an inverted OLED 200. The device includes a substrate 210, an cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190, Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

The molecules disclosed herein may be substituted in a number of different ways without departing from the scope of the invention. For example, substituents may be added to a compound having three bidentate ligands, such that after the substituents are added, one or more of the bidentate ligands are linked together to form, for example, a tetradentate or hexadentate ligand. Other such linkages may be formed. It is believed that this type of linking may increase stability relative to a similar compound without linking, due to what is generally understood in the art as a "chelating effect."

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Factors generally considered when evaluating illumination technology include ease of fabrication, useful lifetime, power efficiency, and the quality of the light source. Many of these factors have important cost implications. Ease of fabrication and useful lifetime affect the cost of buying and replacing or maintaining a light source. Power efficiency affects the cost of operating a light source. The quality of the light source affects suitability for use in particular applications. Some aspects of quality may be quantified using methods well known to the art. For example, CIE ("Commission Internationale d'Eclairage") is a recognized two-coordinate measure of the color of light. Ideal white light has a CIE of (0.33, 0.33). For white light sources, CRI ("Color Rendering Index") is a recognized measure of the color shift that an object undergoes when illuminated by the light source as compared with the color of the same object when illuminated by a reference source comparable to daylight. CRI values range from 0 to 100, with 100 representing no color shift. Bright sunlight may have a CRI of 100. Fluorescent light bulbs have a CRI of 60-99, mercury lamps near 50, and high-pressure sodium lamps can have a CRI of about 20. Lamps used for home or office lighting, for example, generally must meet very strict CIE and CRI requirements, whereas lamps used for street lighting, for example, may be subject to more lenient CIE and CRI requirements.

Based on the standards established by conventional light sources, goals for an OLED used for conventional lighting include a CIE in the range of (0.33±0.10, 0.33+/0.10) and preferably about (0.33, 0.33). Goals for CRI measurements of OLEDs used for lighting include a CRI preferably greater than 75, more preferably greater than about 80, more preferably greater than about 85, and most preferably greater than about 90. Similarly, it is preferable for OLED devices to be efficient. Devices according to the present invention may have an efficiency of at least about 10 lm/W. In preferred embodiments, a device will have an efficiency of at least about 20 lm/W. Preferred embodiments also produce light of at least about 500 cd/m$^2$, with especially preferred embodiments producing light of at least about 1000 cd/m$^2$.

In stacked OLED devices, luminance generally increases with the number of stacked and independent OLED units. Stacked OLEDs may therefore have improved lifetimes and external efficiencies by reducing degradation which may normally result from a single-unit device when higher currents are applied in order to achieve increased brightness.

Stacked OLEDs may comprise emissive layers that emit light of a single color in order to increase the brightness of the device. Similarly, devices may comprise layers that emit light of multiple colors in order to achieve a desired range or blend of emision spectra.

An interlayer is a layer that injects charge carriers but does not have a direct external connection. Interlayers are generally disposed organic units in a stacked device, i.e., they are not the topmost or bottommost electrode in a stacked OLED. When a voltage is applied across on OLED having an interlayer, the interlayer may inject holes into the organic phosphorescent unit on the on the cathode side of the interlayer, and electrons into the organic phosphorescent unit on the anode side. As will be understood by one skilled in the art, the "anode side" of a layer or device refers to the side of the layer or device at which holes are expected to enter the layer or device. Similarly, a "cathode side" refers to the side of the layer or device to which electrons are expected to enter the layer or device.

Each device in a stacked OLED generally requires an anode and a cathode to generate charge. An interlayer may be less efficient at generating charge and injecting charge into other layers than an externally-connected electrode. However, providing external connections to anodes or cathodes not on the top or bottom of the device may be undesirable, as doing so may cause fabrication difficulties and increased cost. When the primary purpose of the device is to emit light from at least one side of the device, anodes or cathodes that are not on the top or bottom of the device may need to be transparent. This results in limitations on the types of matierials available for use as electrodes. Furthermore, these materials may have poor lateral electrical conductivity, and therefore require additional measures to be effective when connected externally. It may therefore be preferable to use an interlayer instead of an externally-connected electrode to generate and inject charge in stacked devices.

Figure 3:
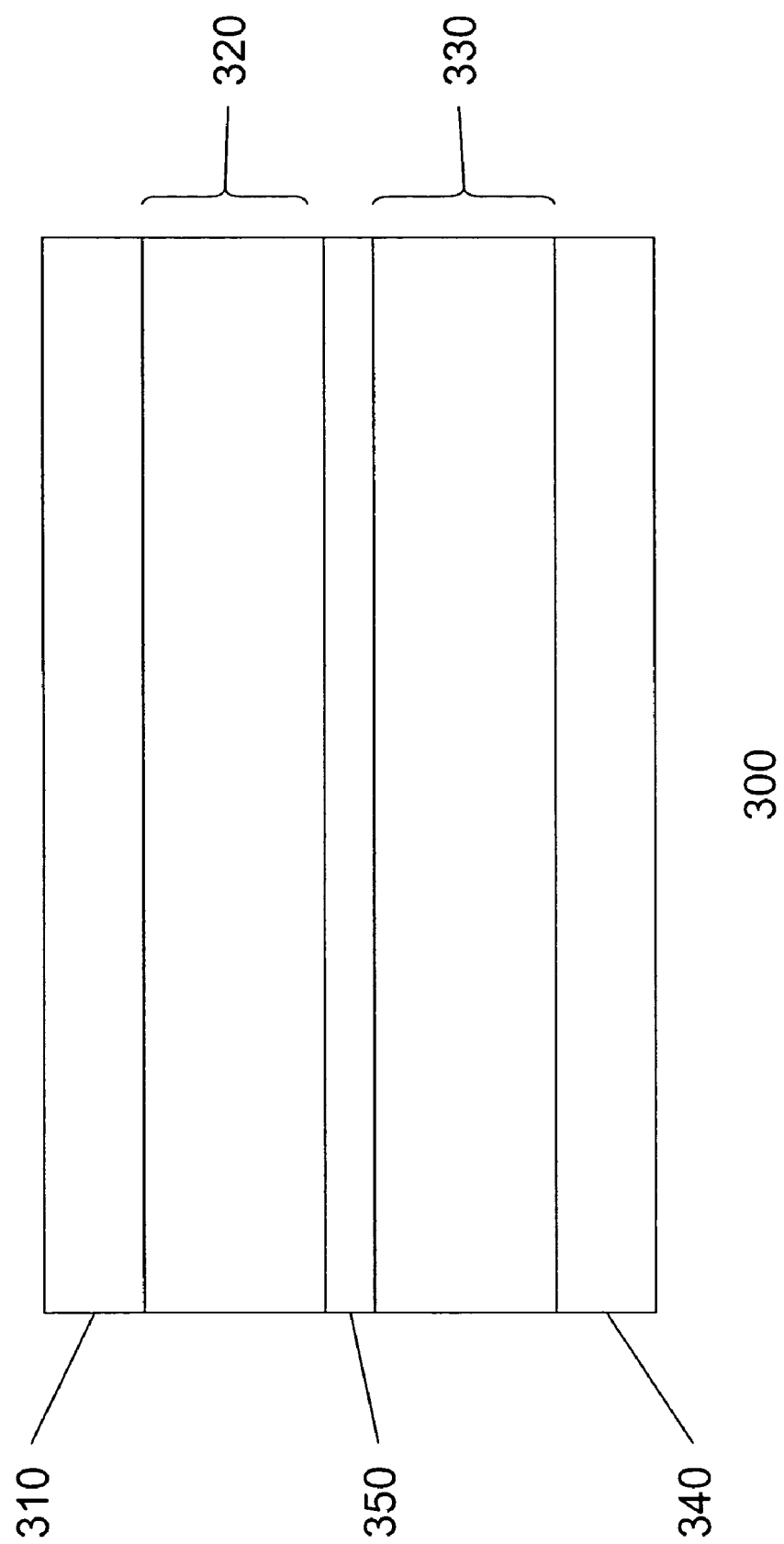
FIG. 3 shows a stacked OLED device having phosphorescent units separated by an interlayer.

FIG. 3 shows a stacked OLED having an interlayer. Device 300 comprises anode 310, organic phosphorescent units 320 and 330, interlayer 350, and cathode 340. Organic phosphorescent units 320 and 330 may comprise multiple layers, such as hole injection layers, electron injection layers, and emissive layers. As will be appreciated by one skilled in the art, other layers may be included. Interlayer 350 is disposed between organic phosphorescent units 320 and 330. Preferred materials for interlayer 350 include metal oxides such as $V_2O_5$, ITO, $RuO_2$, $TiO_2$, and $SnO_2$, with $MoO_3$ being particularly preferred. When voltage is applied across the device, interlayer 350 may inject holes into organic phosphorescent unit 330 and electrons into organic phosphorescent unit 320.

Due to the charge carrier injection properties of interlayer 350, device 300 may have improved efficiencies. Compared to a similar device without an interlayer, device 300 may also produce light of a certain brightness at reduced current densities. It is believed that this may more than double the effective lifetime of the device as compared to that of a similar device.

High efficiency white-emissive OLEDs are of interest due to their potential use in full-color active-matrix OLED displays, and as solid state lighting sources. High brightness may be required for such applications. Although 100% internal quantum efficiency is achieved in phosphorescent devices harvesting both singlet and triplet excitons, the maximum external quantum efficiency may be limited to about 20% due to internal reflection. To achieve increased efficiency and balanced emission intensity of white light, it may be desirable to confine charge carriers, especially excitons, to emissive layers. It may therefore be desirable to include blocking layers that block charge carriers or excitons.

Figure 4:
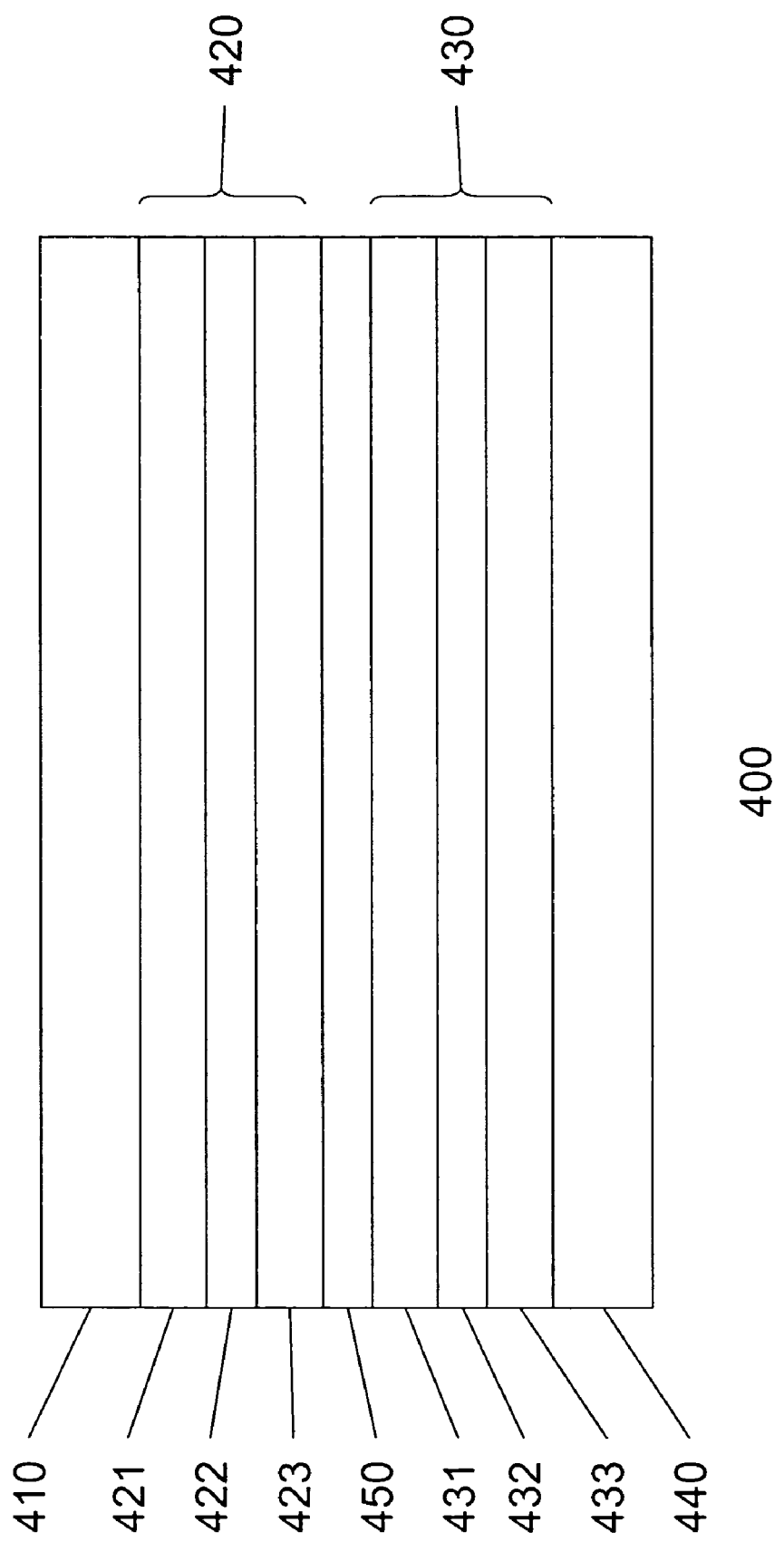
FIG. 4 shows a stacked OLED device having phosphorescent units that include blocking layers.

FIG. 4 shows a device having an interlayer as shown in FIG. 3, with phosphorescent units comprising blocking layers. Interlayers may be less efficient at injecting charge when compared to externally-connected electrodes. This discrepancy in generated and injected charge may lead to charge imbalance problems in devices having an interlayer. For example, charge carriers may be less likely to move from an interlayer to preferred recombination areas in an emissive layer when compared to charge carriers injected by an externally-connected electrode. Surprisingly, it has been found that use of blocking layers or other means of preventing charge movement out of emissive layers, in combination with interlayers, may achieve efficiencies comparable to a device without interlayers. It may therefore be desirable to include blocking layers in a device having an interlayer as a way to confine emission to the emissive layers. FIG. 4 illustrates an example of such a device. Device 400 comprises anode 410, organic phosphorescent units 420 and 430, interlayer 450, and cathode 440. Interlayer 450 may inject electrons and holes as described above. Organic phosphorescent units 420 and 430 further comprise organic emissive layers 422 and 432, which are disposed between blocking layers 421 and 423, and 431 and 433, respectively. Blocking layers 421 and 431 may comprise electron blocking layers, and blocking layers 423 and 433 may comprise hole blocking layers. It may be desirable to block excitons instead of or in addition to charge carriers. Exciton blocking may be especially desirable in phosphorescent devices. Blocking layers 421, 423, 431, and 433 may therefore comprise exciton blocking layers. A device that comprises exciton blocking layers is believed to have a greater external quantum efficiency due to confinement of excitons within emissive layers. The increased efficiency may also contribute to brighter, more white light, and increased device lifetimes.

Another way to render charge movement out of emissive layers unlikely may be the use of direct trapping. A non-limiting theory of the invention using direct trapping is that excitons may be created on a dopant in an emissive layer, and recombine without leaving the dopant. This may be lead to a higher efficiency than arrangements where excitons are formed on the host material and must move to the dopant before the desired recombination occurs. It is believed that one way of achieving direct trapping is to confine at least one type of charge carrier to the dopant in an emissive layer; that is, to reduce the presence of that type of charge carrier from in the emissive layer other than on the dopant. For example, holes may be trapped using a phosphorescent dopant having a HOMO at least about 0.3 eV higher than the HOMO of the host. Since holes move to higher HOMOs, holes may then be much more likely to move from adjacent layers onto the dopant than the host, and unlikely to leave the dopant to move to the host material and/or adjacent layers once on the dopant.

Other criteria may be useful in confining charge carriers to emissive layer dopants. For example, in addition to the energetics previously described, but not necessarily, it may be advantageous for a charge transport layer adjacent to the emissive layer to have an energy level sufficiently offset from that of the host to render unlikely charge movement from the emissive layer dopant to the adjacent charge transport layer. With regard to holes, a charge transport layer adjacent to an emissive layer will preferably have a HOMO at least about 0.3 eV higher than the HOMO of the host material. A higher HOMO in the charge transport layer may be desirable to reduce the probability of holes moving into the charge transport layer from the emissive layer. A short relaxation time may also be preferable but not necessary. As used herein, "relaxation time" refers to the average time that a charge carrier may take to move from the host to the dopant. A low relaxation time may be desirable to allow charge carriers that may move onto the host material to subsequently move onto the dopant before combining with an oppositely-charge charge carrier. A relaxation time of not more than about 1 ns may be especially preferred.

Similar energetics may apply to the LUMOs of devices with respect to electron movement within the device. As an example, a phosphorescent dopant having a LUMO at least about 0.3 eV lower than the LUMO of the emissive layer host material may serve to trap electrons on the dopant. A charge transport layer adjacent to the emissive layer may preferably, but not necessarily, have a LUMO at least about 0.3 eV lower than the LUMO of the host material. Electrons may therefore become trapped on the dopant, increasing the probability that excitons will form predominantly on the dopant, and probably recombine without moving off the dopant.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting.

Material Definitions:

As used herein, abbreviations refer to materials as follows:

| | |
|---|---|
| CBP: | 4,4'-N,N-dicarbazole-biphenyl |
| m-MTDATA | 4,4',4''-tris(3-methylphenylphenlyamino)triphenylamine |
| $Alq_3$: | 8-tris-hydroxyquinoline aluminum |
| Bphen: | 4,7-diphenyl-1,10-phenanthroline |
| n-BPhen: | n-doped BPhen (doped with lithium) |
| $F_4$-TCNQ: | tetrafluoro-tetracyano-quinodimethane |
| p-MTDATA: | p-doped m-MTDATA (doped with $F_4$-TCNQ) |
| $Ir(ppy)_3$: | tris(2-phenylpyridine)-iridium |
| $Ir(ppz)_3$: | tris(1-phenylpyrazoloto,N,C(2')iridium(III) |
| BCP: | 2,9-dimethyl-4,7-diphenyl-1,10-phenanthroline |
| TAZ: | 3-phenyl-4-(1'-naphthyl)-5-phenyl-1,2,4-triazole |
| CuPc: | copper phthalocyanine. |
| ITO: | indium tin oxide |
| NPD: | N,N'-diphenyl-N-N'-di(1-naphthyl)-benzidine |
| TPD: | N,N'-diphenyl-N-N'-di(3-toly)-benzidine |
| BAlq: | aluminum(III)bis(2-methyl-8-hydroxyquinolinato)4-phenylphenolate |
| mCP: | 1,3-N,N-dicarbazole-benzene |
| DCM: | 4-(dicyanoethylene)-6-(4-dimethylaminostyryl-2-methyl)-4H-pyran |
| DMQA: | N,N'-dimethylquinacridone |

-continued

| | |
|---|---|
| PEDOT:PSS: | an aqueous dispersion of poly(3,4-ethylenedioxy-thiophene) with polystyrenesulfonate (PSS) |
| PQIr: | iridium(III) bis(2-phenyl quinolyl-N,C2') acetylacetonate |
| Ir(46dfppy)$_3$: | tris-(1-(4,6-difluorophenyl)pyridinato,N,C$^{2'}$)Ir(III) |
| FIrpic: | bis(2-(4,6-difluorophenyl)pyridy1-N, C2')iridium(III) picolinate |
| FIr6: | iridium(III) bis(4',6'-difluorophenylpyridinato)tetrakis(1-pyrazolyl)borate |
| FlzIr: | tris(1-(9', 9' dimethyl-2'-fluorenyl)pyrzaolato, N, C2) iridium(III) |

EXPERIMENTAL

Specific representative embodiments of the invention will now be described, including how such embodiments may be made. It is understood that the specific methods, materials, conditions, process parameters, apparatus and the like do not necessarily limit the scope of the invention.

Devices having a metal oxide interlayer were fabricated with the structure shown below.

| Layer | Thickness (Angstroms) |
|---|---|
| Al | 500 |
| MoO$_3$ or V$_2$O$_5$ | 100 |
| Bphen:Li | 200 |
| Bphen | 200 |
| CBP: 6% Irppy | 200 |
| Irppz | 100 |
| NPD | 300 |
| ITO | |

Figure 7:
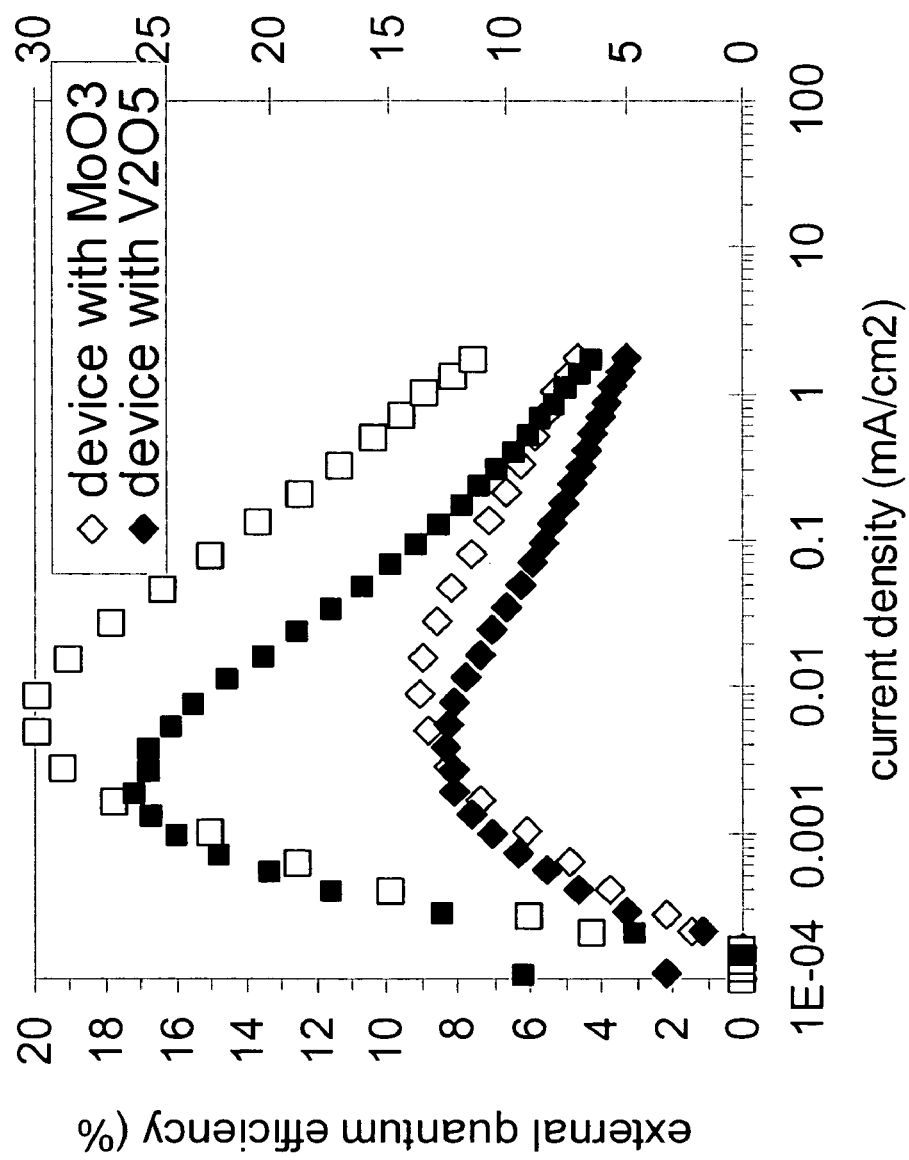
FIG. 7 shows plots of external quantum efficiency vs. current density for devices having interlayers.
Figure 8:
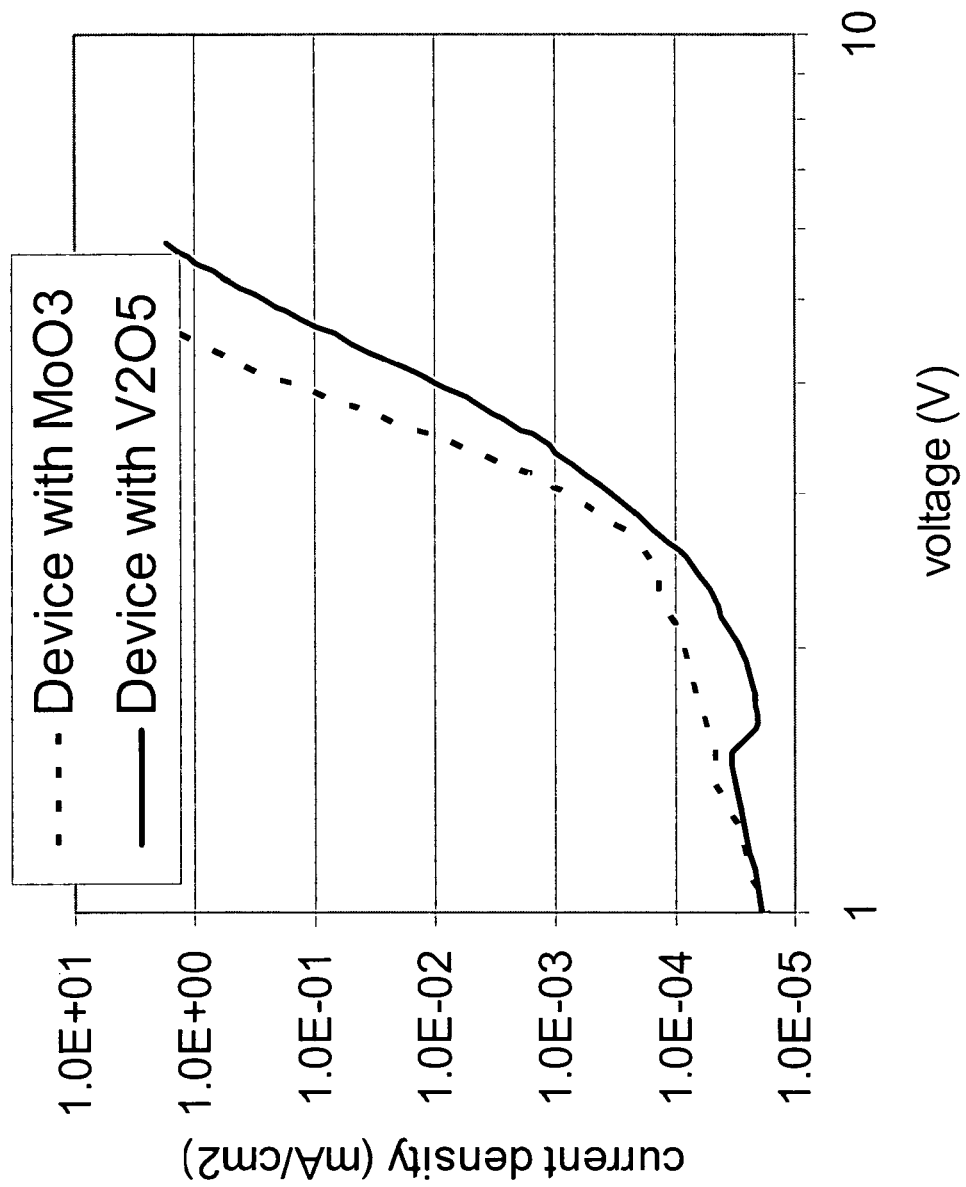
FIG. 8 shows plots of current density vs. voltage for devices having interlayers.

Efficiencies and densities were measured for an OLED device having a charge injection layer of either MoO$_3$ or V$_2$O$_5$. FIG. 7 shows the external quantum efficiencies and power efficiencies of the two devices as functions of the current density. FIG. 8 shows current densities of the devices as a function of the applied voltage.

Devices having a metal oxide interlayer were fabricated having the structure shown below.

| Layer | Thickness (Angstroms) | HOMO/LUMO Energy Levels (eV) |
|---|---|---|
| LiF/Al | 8/500 | |
| Alq:Li | 100 | 5.7/3.0 |
| BCP | 300 | 6.4/3.0 |
| CBP: 6% PQIr | 200 | 6.1/3.0:5.0/2.7 |
| NPD | 500 | 5.5/2.4 |
| MoO$_3$ or V$_2$O$_5$ | 100 | |
| Alq:Li | 200 | 5.7/3.0 |
| BCP | 200 | 6.4/3.0 |
| CBP: 6% Irppy | 200 | 6.1/3.0:5.1/2.6 |
| Irppz | 50 | 5.0/1.6 |
| NPD | 300 | 5.5/2.4 |
| ITO | | |

Figure 5:
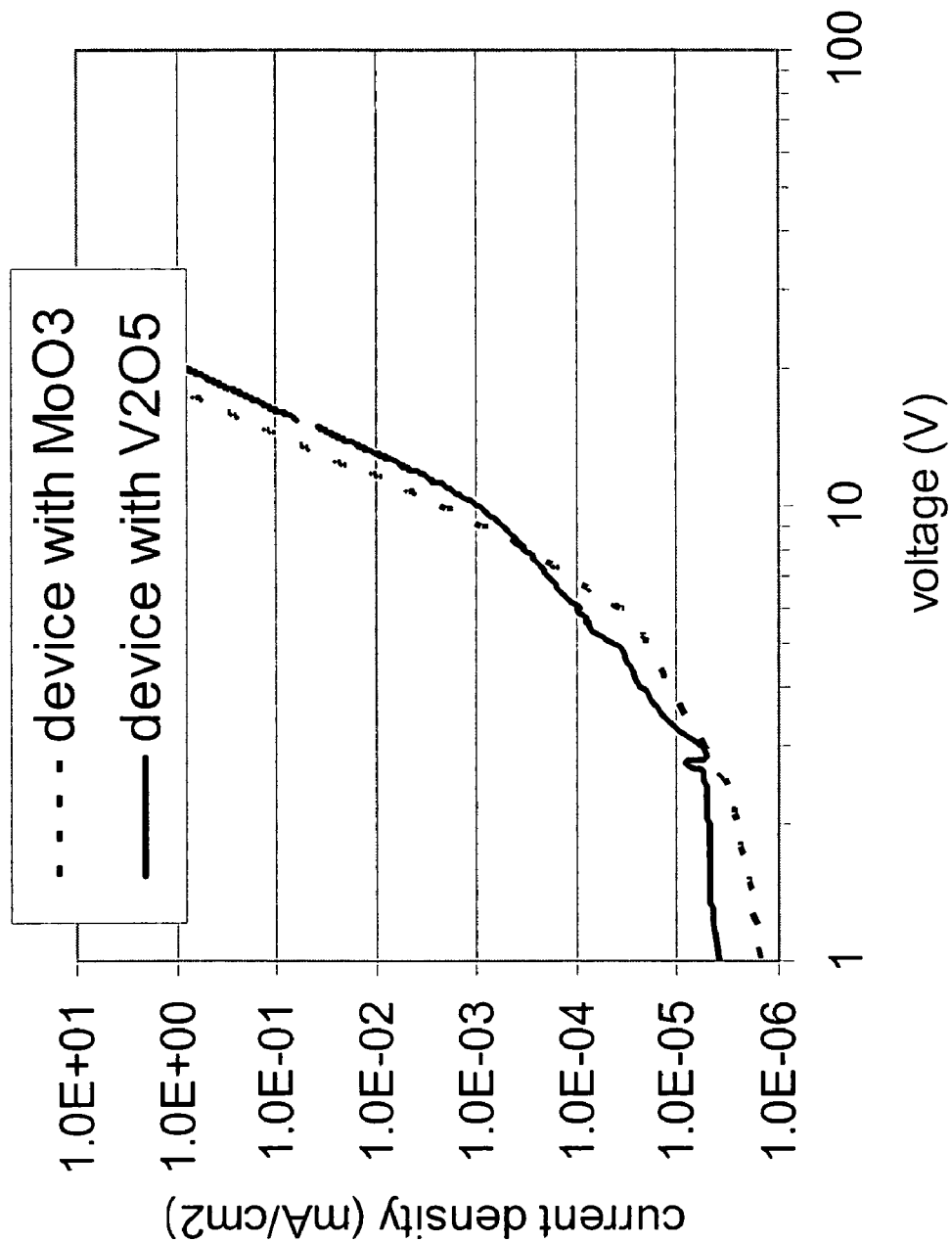
FIG. 5 shows plots of current density vs. voltage for devices having interlayers.
Figure 6:
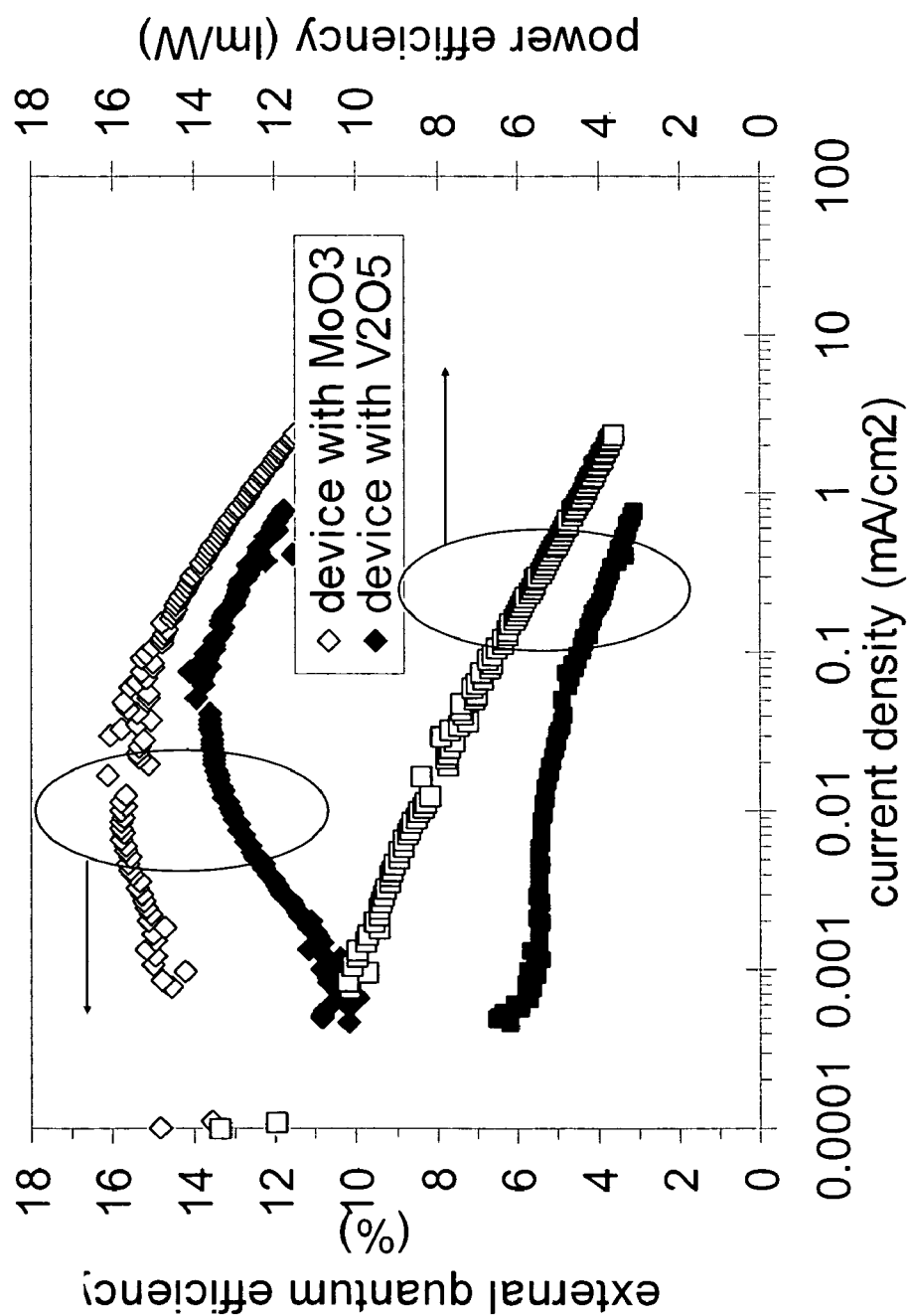
FIG. 6 shows plots of external quantum efficiency and power efficiency vs. current density for devices having interlayers.

Efficiencies and current densities were measured for stacked OLED devices having an interlayer of either MoO$_3$ or V$_2$O$_5$. FIG. 5 shows current densities of the devices as a function of the applied voltage. FIG. 6 shows the external quantum efficiencies and power efficiencies of the two devices as functions of the current density.

A non-limiting theory of the invention as illustrated by the device described above is that charge carriers may become trapped on the PQIr and Irppy dopants in the emissive host layers of CBP. For example, holes may become trapped on the PQIr dopant in the CBP:PQIr layer. PQIr has a higher HOMO of 5.0 eV compared to the HOMO of the CBP host material of 6.1 eV. There is therefore a greater probability that excitons will form on the PQIr dopant than on the CBP host. The majority of excitons formed in the CBP:PQIr layer may therefore form on the PQIr dopant.

Figure 9:
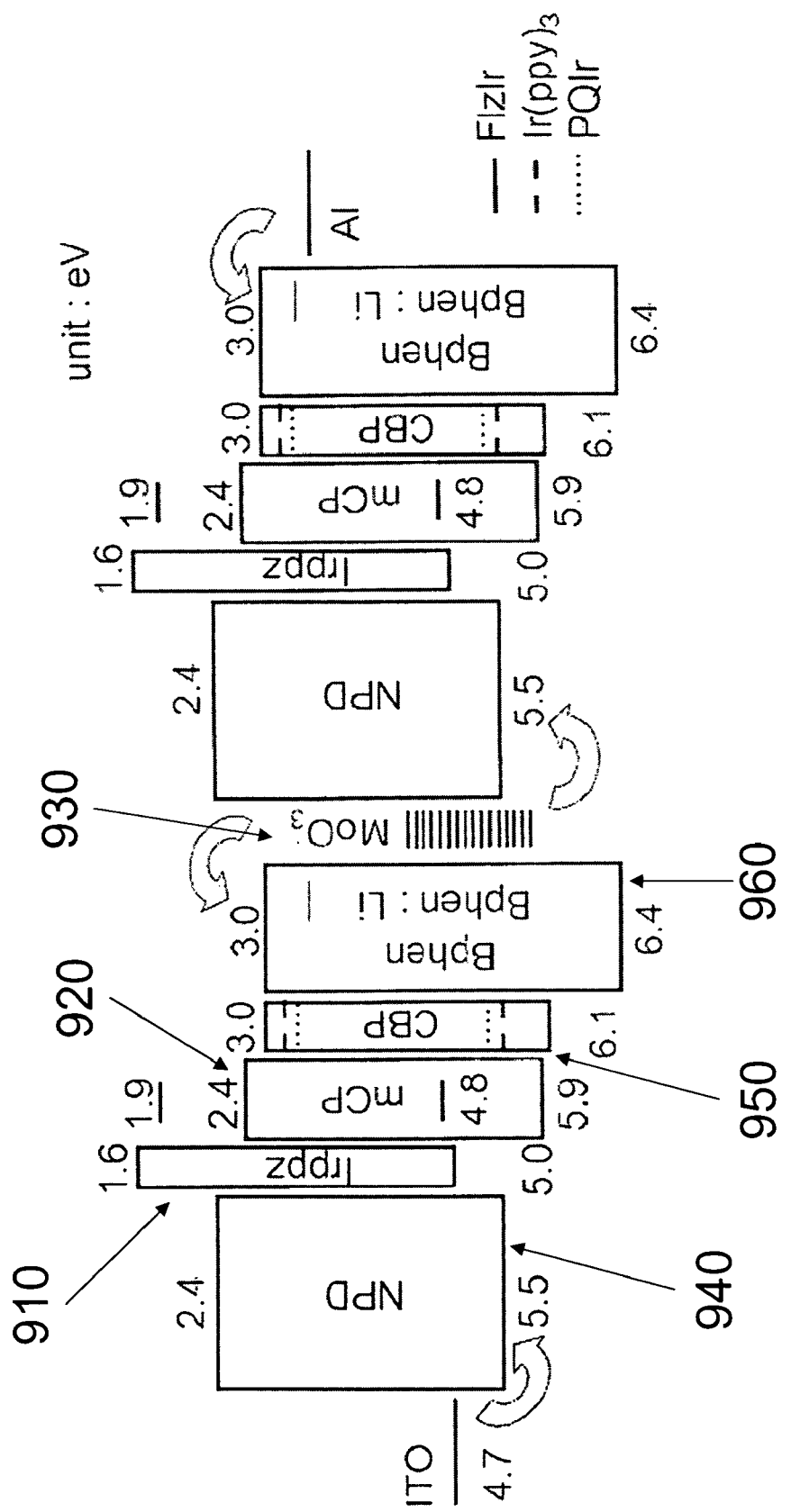
FIG. 9 shows an energy level diagram of a stacked OLED device.

A stacked device having a metal oxide interlayer with energy levels as previously described was fabricated with the structure ITO/NPD/Irppz/mCP:FlzIr/CBP:Ir(ppy)$_3$,PQIr/Bphen/MoO$_3$/NPD/Irppz/mCP:FlzIr/CBP:Ir(ppy)$_3$,PQIr/Bphen/Al was fabricated. An energy diagram of the device is shown in FIG. 9. According to a non-limiting theory of the invention, the MoO$_3$ interlayer 930 may inject holes into the adjacent Bphen layer 960. The holes may move through the CBP layer 950 to the mCP:FlzIr layer 920. Holes entering the mCP:FlzIr emissive layer 920 may become trapped on the FlzIr dopant due to the higher HOMO of FlzIr (4.8 eV) compared to mCP (5.9 eV) and CBP (6.1 eV). Note that a "higher" HOMO is one that is shown closer to the top of the energy level diagram shown in FIG. 9, as previously discussed. The majority of excitons formed in the mCP:FlzIr layer 920 may therefore form on the FlzIr dopant instead of the mCP host.

Stacked OLED (SOLED) devices were fabricated and tested as shown below.

| Device | Structure* | max $\eta_{ext}$ (%) | max $\eta_p$ (lm/W) | max efficiency (cd/A) | voltage at J = 10 | CIE (x, y) at J = 10 | CRI |
|---|---|---|---|---|---|---|---|
| 1-SOLED | EPa | 13.6 ± 1.2 | 28.9 ± 2.5 | 34.9 ± 3.1 | 9.2 | (0.37, 0.46) | 62 |
| 2-SOLED | EPa/MoO$_3$/EPb | 24.7 ± 1.9 | 28.9 ± 2.2 | 66.6 ± 5.0 | 18.0 | (0.39, 0.45) | 64 |
| 3-SOLED | EPa/MoO$_3$/EPc/MoO$_3$/EPc | 34.9 ± 2.2 | 22.7 ± 1.4 | 77.0 ± 5.0 | 24.1 | (0.35, 0.44) | 66 |
| 2-SOLED-a** | EPa/MoO$_3$/EPb | 9.8 ± 1.0 | 4.5 ± 0.5 | 21.9 ± 2.2 | 32.6 | (0.53, 0.43) | 56 |

*EP = electrophosphorescent subpixel element comprising NPD (variable thickness)/Ir(ppz)$_3$ (10 nm)/10 wt % FlzIr:mCP (20 nm)/PQIr: 3 wt % Ir(ppy)$_3$: CBP (5 nm)/Bphen (20 nm)/BPhen:Li (1:1 molar ratio) (20 nm). The NPD thickness in each EL element is EPa: 40 nm, EPb: 100 nm, EPc: 60 nm.
**The EP element has BPhen (20 nm) instead of BPhen:Li (20 nm) adjacent to MoO$_3$.

Figure 10:
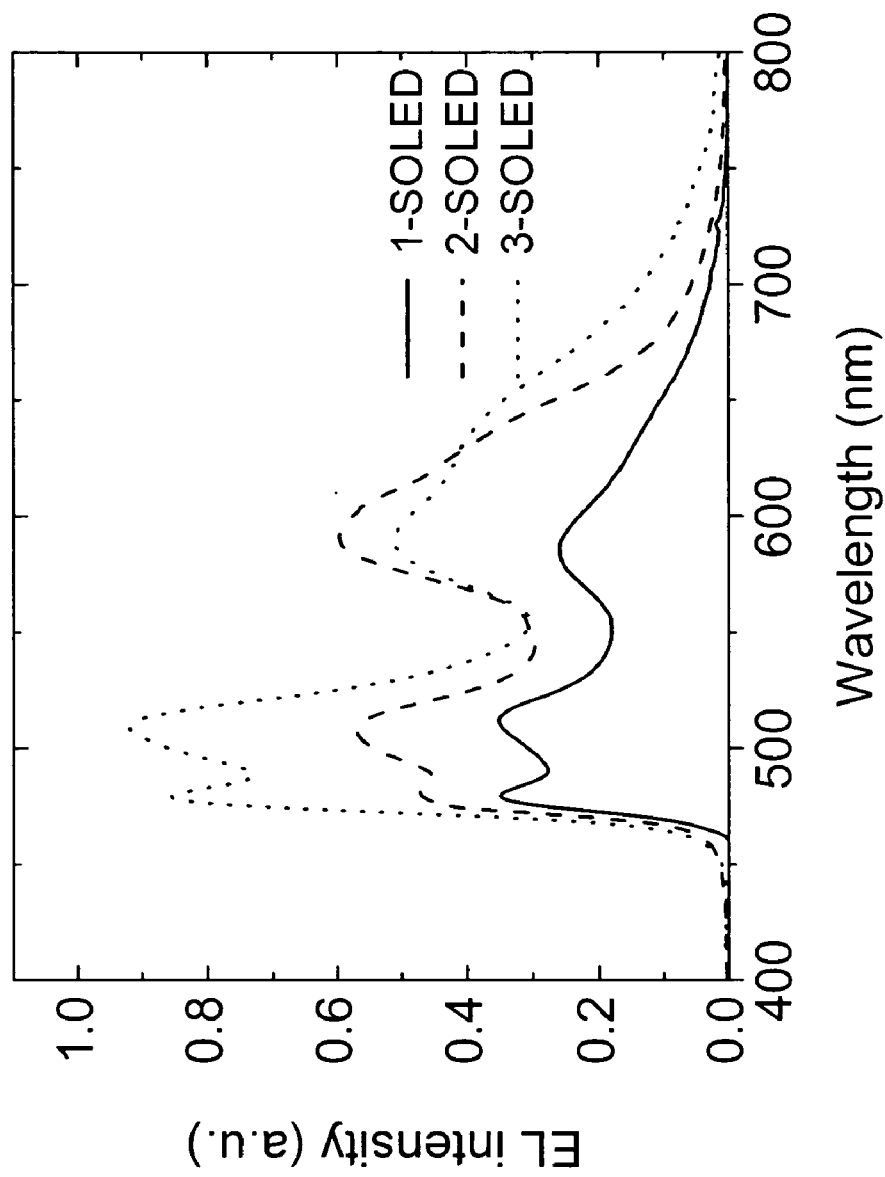
FIG. 10 shows electrophosphorescent spectra of 1-, 2-, and 3-SOLEDs measured at a current density of $J=10$ mA/cm$^2$.

FIG. 10 shows electrophosphorescent spectra of 1-, 2-, and 3-SOLEDs measured at a current density of J=10 mA/cm². It is believed that the change in the spectrum of the 3-SOLED device is a result of the optical effects such as direct trapping previously discussed.

Figure 11:
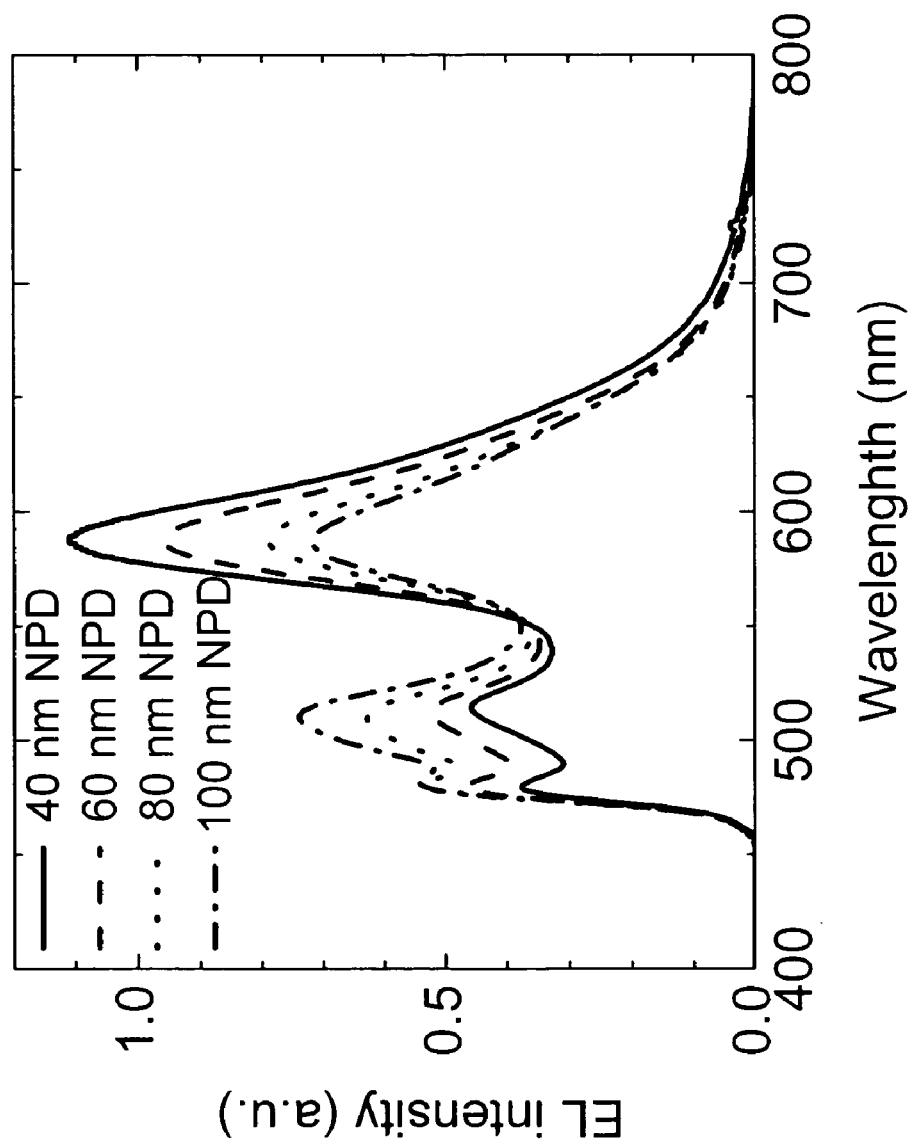
FIG. 11 shows electrophosphorescent spectra of stacked OLED devices that emit white light.
Figure 12:
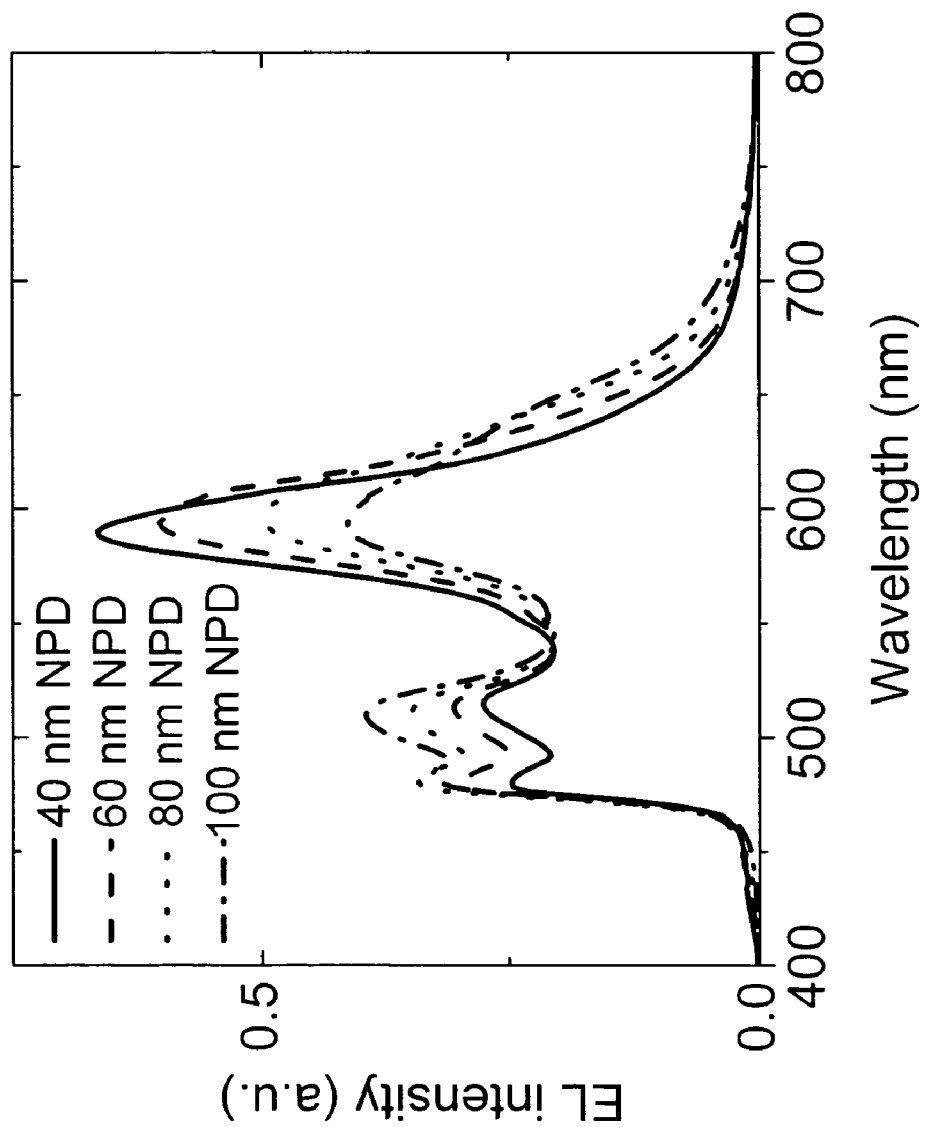
FIG. 12 shows optical simulations of electrophosphorescent spectra for stacked OLED devices.

FIG. 11 shows electrophosphorescent spectra of white SOLEDs measured at a current density of 10 mA/cm² with NPD layer thicknesses varying between 40 and 100 nm. It was found that the FlzIr emission may become more intense with thicker NPD layers without significantly affecting operational voltage and external efficiencies. Optical simulations of the electrophosphorescent spectra for 2-SOLED devices are shown in FIG. 12. The devices in FIGS. 11 and 12 have the following structure: NPD (40 nm)/Ir(ppz)₃ (10 nm)/mCP:10 wt % Ir(flz)₃ (20 nm)/CPB:3 wt % Ir(ppy)₃:10 wt % PQIr/Bphen(20 nm)/Bphen:Li (1:1 molar ratio) (20 nm)/MoO₃ (10 nm)/NPD (x nm)/Ir(ppz)₃ (10 nm)/mCP:10 wt % Ir(flz)₃ (20 nm)/CPB:3 wt % Ir(ppy)₃:10 wt % PQIr/Bphen (20 nm)/Bphen:Li (1:1 molar ratio) (20 nm)/Al (50 nm). The NPD thickness was varied as shown in FIGS. 11 and 12.

Figure 13:
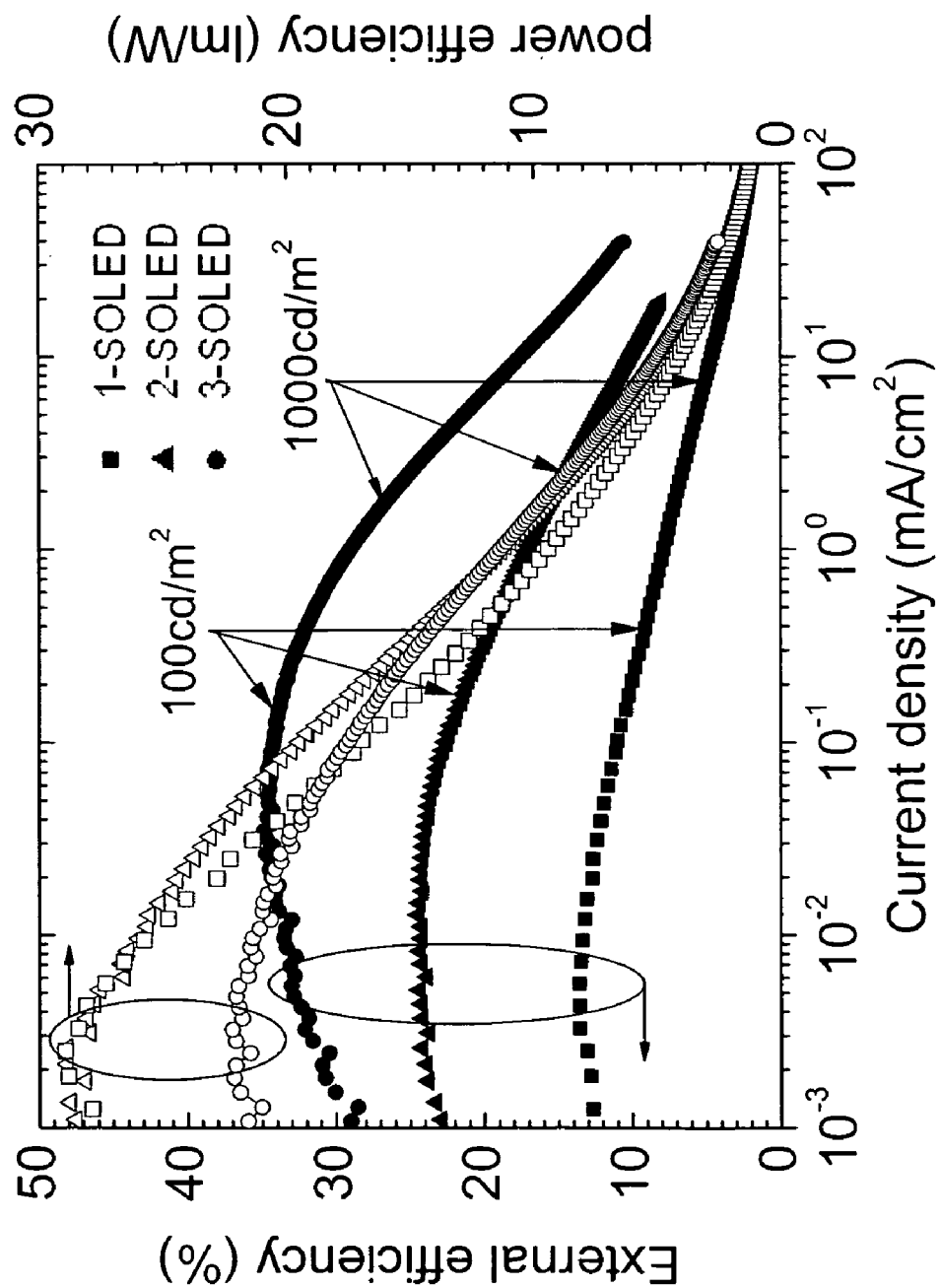
FIG. 13 shows power efficiencies for stacked OLED devices.
Figure 14:
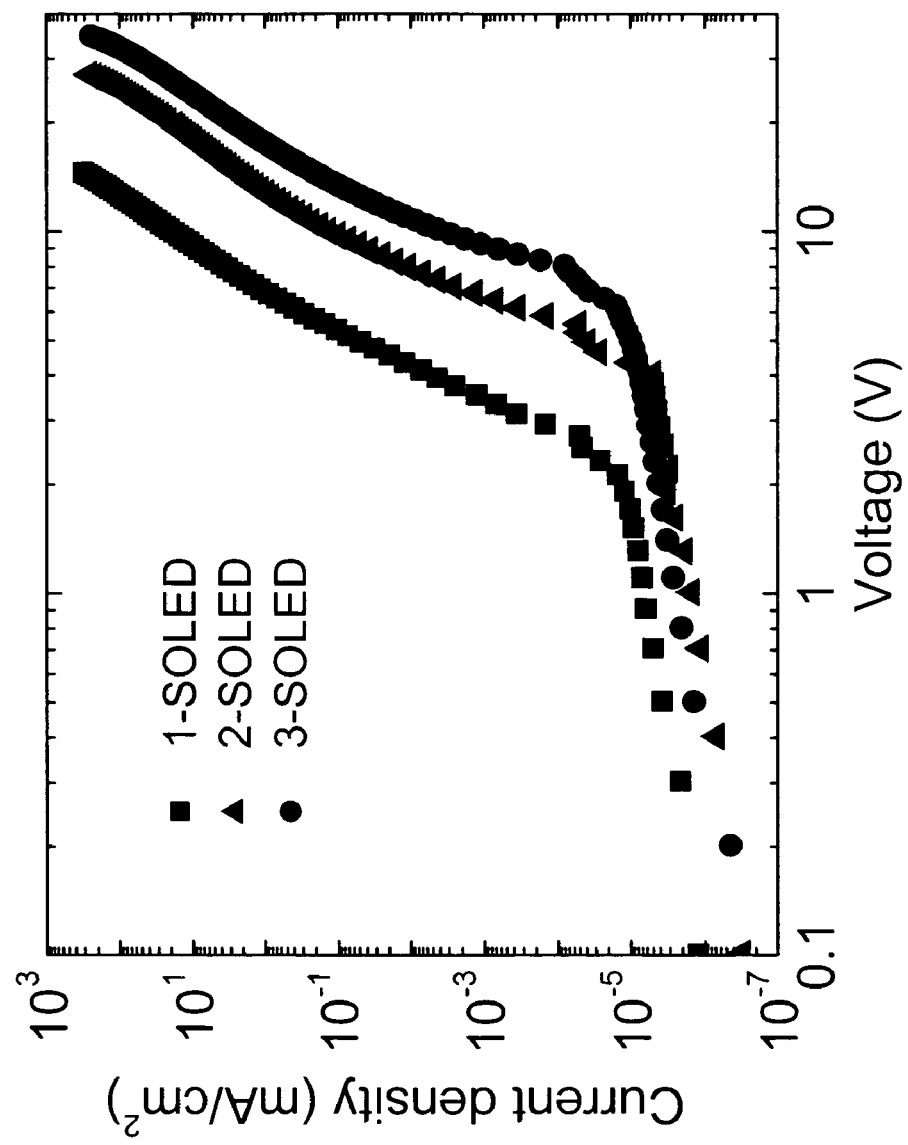
FIG. 14 shows current and voltage characteristics for stacked OLED devices.

FIG. 13 shows forward-viewing power efficiencies for the 1-, 2-, and 3-SOLED devices described above as functions of current density. It was found that the maximum external efficiencies of the devices were roughly proportional to the number of sub-pixels over a range of current densities. FIG. 14 shows current vs. voltage characteristics of the devices.

Stacked devices having the following structures were fabricated:

| Device | |
|---|---|
| Device A | NPD (50 nm)/Ir(ppz)3 (10 nm)/mCP: 10% Ir(flz)3 (20 nm)/CPB: 3% Ir(ppy)3: 10% PQIr/Bphen (20 nm)/Bphen:Li (1:1 molar ratio)(20 nm)/MoO3 (10 nm)/NPD (50 nm)/Ir(ppz)3 (10 nm)/mCP: 10% Ir(flz)3 (20 nm)/CPB: 3% Ir(ppy)3: 10 wt % PQIr/Bphen (20 nm)/Bphen:Li (1:1 molar ratio) (20 nm)/Al (50 nm). |
| Device B | NPD (50 nm)/—/mCP: 10% Ir(flz)3 (20 nm)/CPB: 3% Ir(ppy)3: 10% PQIr/Bphen (20 nm)/Bphen:Li (1:1 molar ratio)(20 nm)/MoO3 (10 nm)/NPD (50 nm)/Ir(ppz)3 (10 nm)/mCP: 10% Ir(flz)3 (20 nm)/CPB: 3% Ir(ppy)3: 10 wt % PQIr/Bphen (20 nm)/Bphen:Li (1:1 molar ratio) (20 nm)/Al (50 nm). |
| Device C | NPD (50 nm)/—/mCP: 10% Ir(46dfppy)3 (20 nm)/CPB: 3% Ir(ppy)3: 10% PQIr/Bphen (20 nm)/Bphen:Li (1:1 molar ratio)(20 nm)/MoO3 (10 nm)/NPD (50 nm)/Ir(ppz)3 (10 nm)/mCP: 10% Ir(46dfppy)3 (20 nm)/CPB: 3% Ir(ppy)3: 10 wt % PQIr/Bphen (20 nm)/Bphen:Li (1:1 molar ratio) (20 nm)/Al (50 nm). |

Figure 15:
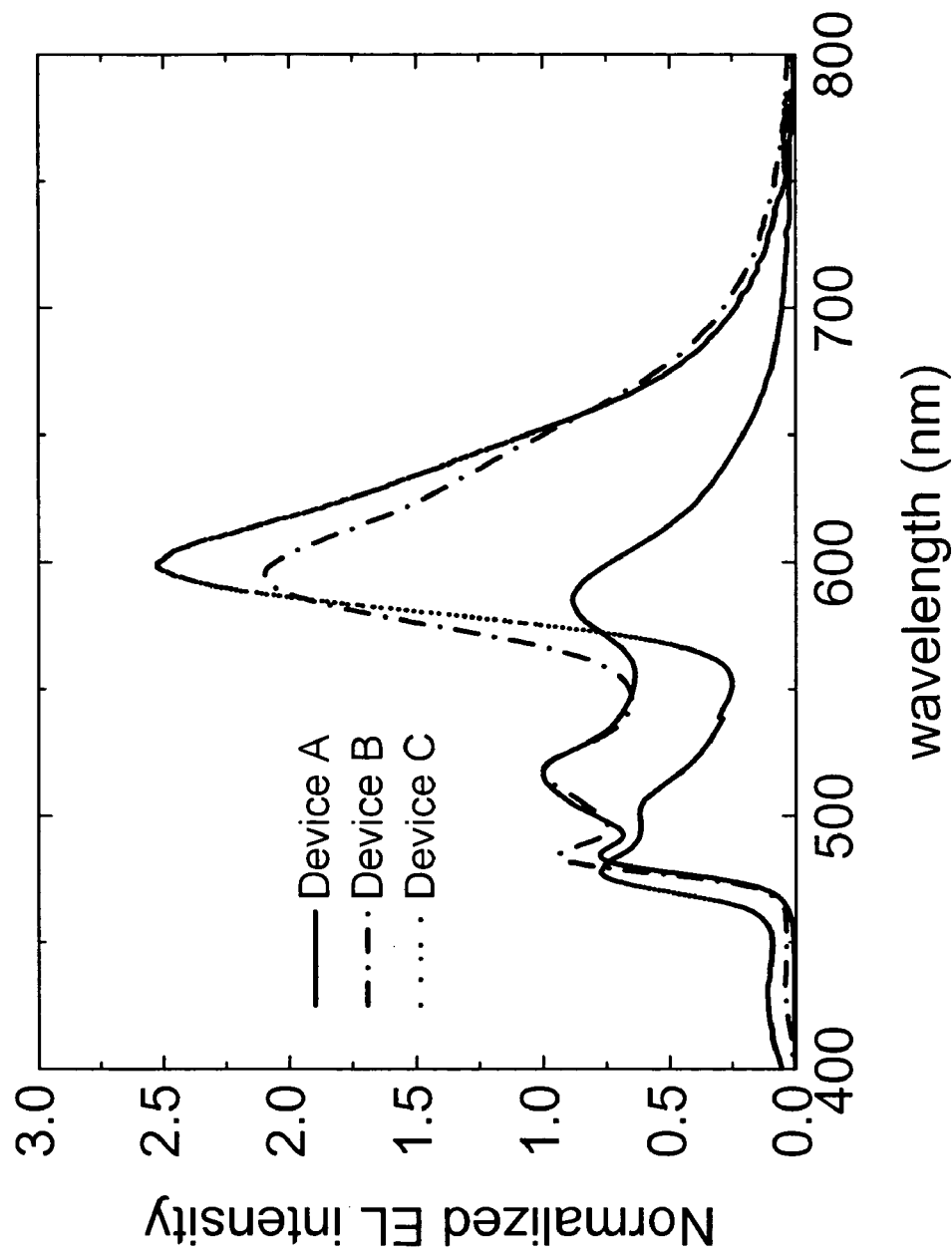
FIG. 15 shows emission spectra for stacked OLED devices having blocking layers and/or emissive dopants.
Figure 16:
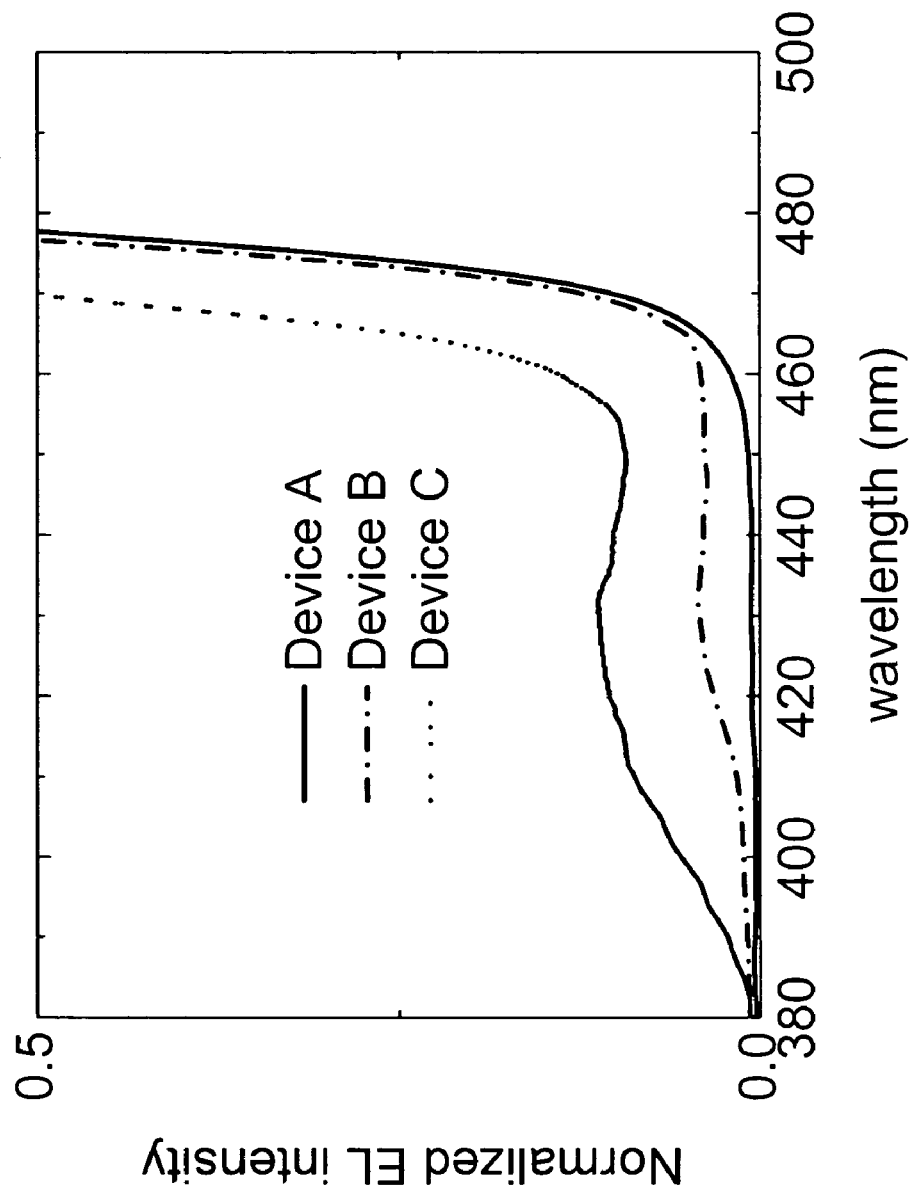
FIG. 16 shows a magnified view of one part of the emission spectra shown in FIG. 15.

It is believed that the use of Irppz as a blocking layer and FlzIr as an emissive dopant result in a more efficient device. A blocking layer such as the Ir(ppz)₃ layer in device A may prevent emission from adjacent layers such as the NPD layers in devices A, B, and C. The use of blocking layers is believed to contribute to a well-balanced emission spectrum, resulting in more white light. Similarly, it is believed that the use of a direct trapping dopant such as FlzIr, may contribute to increased efficiency in the device and result in a higher probability that excitons will form on the emissive dopant, further reducing emission from adjacent layers. FIG. 15 shows emission spectra for devices A, B, and C. A magnified view of the emission spectra in the NPD emission range is shown in FIG. 16. It was found that device C has increased emission from the NPD layer as evidenced by the fact that the spectrum of device C in the NPD emission range is higher and increases faster than those of devices A and B. Similarly, device A was found to have reduced emission from the NPD layer.

Figure 17:
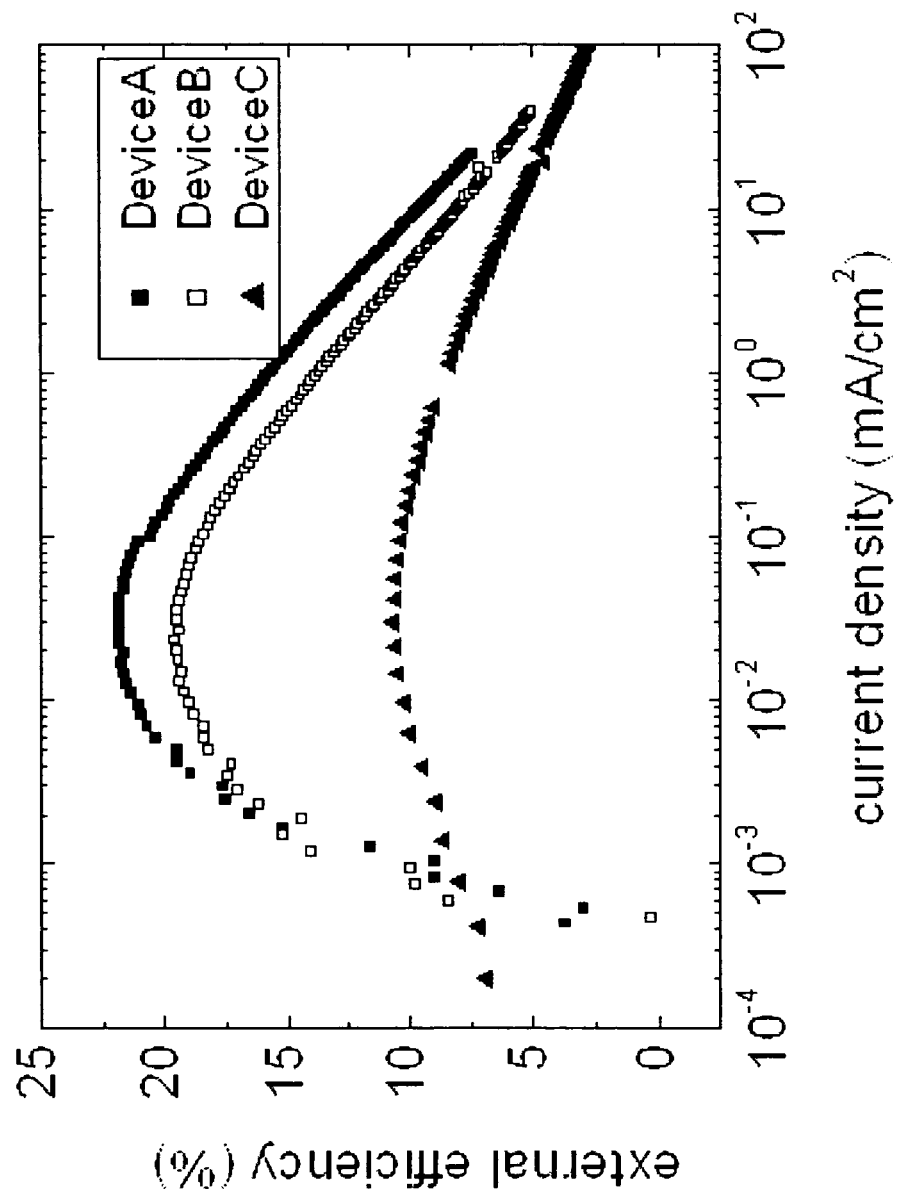
FIG. 17 shows plots of external efficiency vs. current density for devices A, B, and C.
Figure 18:
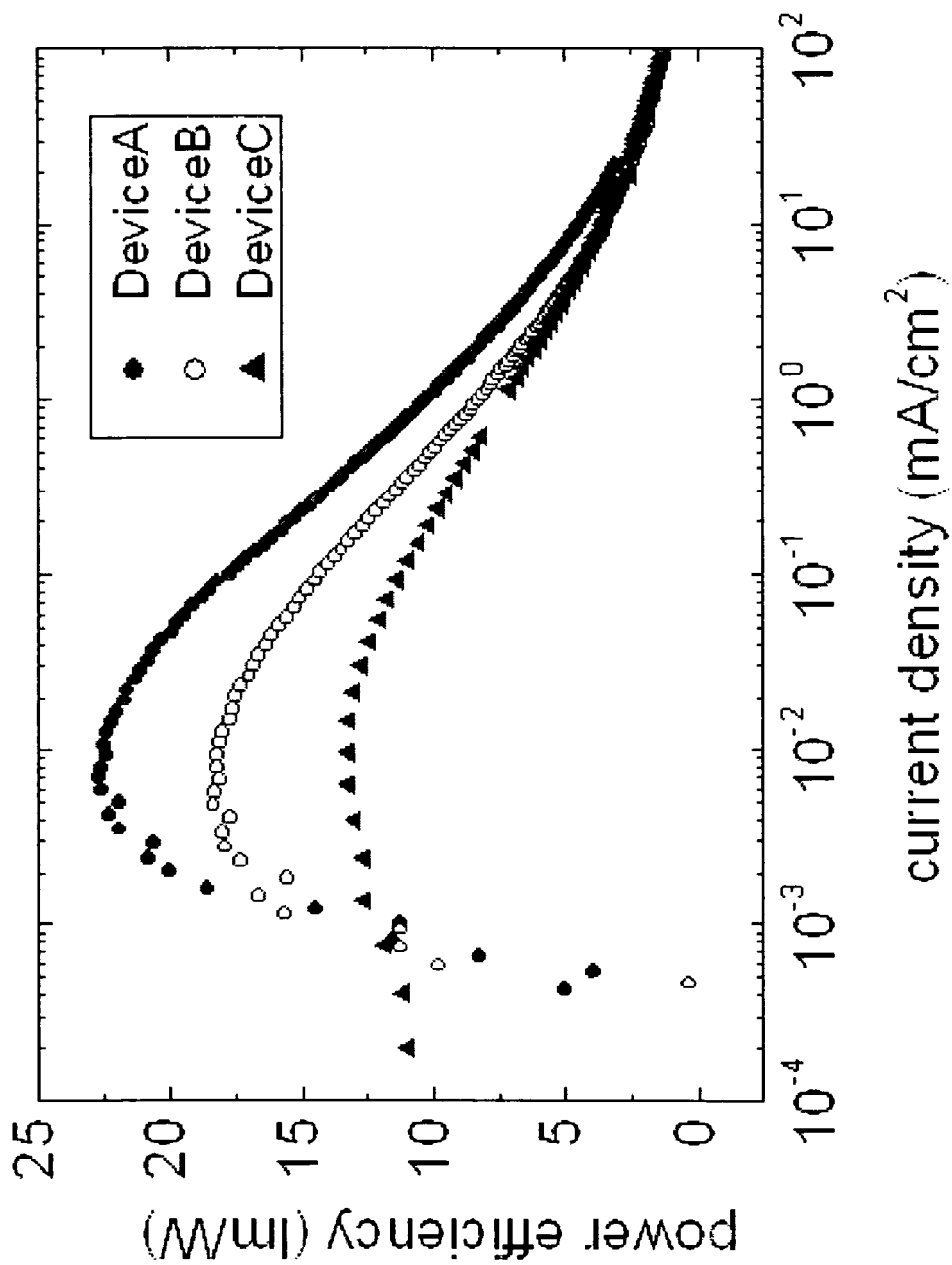
FIG. 18 shows plots of power efficiency vs. current density for devices A, B, and C.

It is believed that these results are a result of the use of a blocking layer, such as Ir(ppz)₃ in device A, and an emissive dopant that can cause direct trapping of excitons, such as FlzIr in devices A and B. Surprisingly, device B, which does not have a blocking layer, has reduced NPD emission relative to device C. According to a non-limiting theory of the invention, electron injection from the mCP and CBP layers into the FlzIr layer is unfavorable due to the high LUMO of FLzIr. Direct excitation of the triplet state in FlzIr therefore may be more likely via electron injection from the LUMO of CBP and/or mCP. Unlike other dopants, such as FIr6, FIrpic, and Ir(46dfppy)₃ that have deep LUMO levels, an emissive layer doped with FlzIr results in surprisingly decreased emission from the NPD layer, leading to a higher efficiency. For example, FIr6 has a LUMO of 3.1 eV and Firpic has a LUMO of 3.2 eV, compared to a LUMO of 1.9 eV in FlzIr. This energy level configuration is believed to block electron leakage into the adjacent hole transport layer, resulting in excitation of the triplet level directly from excitons on the dopant molecules. Similarly, referring to FIGS. 17 and 18, it is believed that the reduction of emission in the NPD layers results in increased efficiencies for stacked devices. Device C, which has increased NPD emission, has reduced external and power efficiencies as shown in FIGS. 17 and 18, respectively.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A device comprising:
   an anode;
   a cathode;
   an interlayer comprising a metal oxide disposed between the anode and the cathode;
   a first organic phosphorescent unit disposed between and electrically connected to the anode and the interlayer; and
   a second organic phosphorescent unit disposed between and electrically connected to the interlayer and the cathode;
   wherein each of the first and second phosphorescent units further comprises an organic emissive layer, the organic emissive layer comprising an organic host material and a first organic dopant material and a second organic dopant material, wherein the first organic dopant material has a LUMO of at least 0.3 eV lower than the LUMO of the organic host material;
   wherein each of the first and second organic phosphorescent units further comprises an exciton blocking layer; and
   wherein the device emits white light with a CIE in the range of (0.33±0.20, 0.33±0.20) and a CRI of at least 60.

2. The device of claim 1, wherein the organic host material has a HOMO at least 0.3 eV lower than the HOMO of an adjacent layer, a LUMO at least 0.3 eV higher than the LUMO of an adjacent layer, or both.

3. The device of claim 1 wherein:
   the anode comprises ITO;
   the cathode comprises Al;
   the interlayer comprises MoO₃; and
   the emissive layer comprise mCP, CBP, or both.

4. The device of claim 1, wherein the interlayer is a first interlayer, and further comprising:
   a second interlayer disposed between the first interlayer and the cathode; and a third organic phosphorescent unit disposed between and electrically connected to the first interlayer and the second interlayer;

wherein the second organic phosphorescent unit is disposed between and electrically connected to the second interlayer and the cathode.

5. The device of claim 1 wherein the metal oxide is $V_2O_5$, indium tin oxide, $RuO_2$, $TiO_2$ or $SnO_2$.

6. The device of claim 1 wherein the metal oxide is $MoO_3$.

7. The device of claim 1 wherein the device has an efficiency of at least 10 lm/W.

8. The device of claim 1 wherein the device has an efficiency of at least 20 lmn/W.

9. The device of claim 1 wherein the device produces light with a brightness of at least 500 cd/m² lumens.

10. The device of claim 1 wherein the first organic dopant material has a HOMO at least 0.3 eV higher than the HOMO of the organic host material.

11. The device of claim 10 wherein:
the anode comprises ITO;
the cathode comprises Al;
the interlayer comprises $MoO_3$;
each of the organic host materials comprises mCP; and
each of the organic dopant materials comprises FIzIr.

12. The device of claim 10, wherein the organic host material has a HOMO at least 0.3 eV lower than the HOMO of a layer adjacent to the anode side of the phosphorescent unit.

13. The device of claim 12, wherein the layer adjacent to the anode side of the phosphorescent unit is a hole transport layer.

14. The device of claim 1, wherein the organic host material has a LUMO at least 0.3 eV higher than the LUMO of an adjacent layer.

15. The device of claim 14, wherein the adjacent layer is an electron transport layer.

16. The device of claim 1, wherein the organic host material is a first organic host material, and wherein the emissive layer in each of the first and second phosphorescent units further comprises a second organic host material.

17. The device of claim 16, wherein:
the anode comprises ITO;
the cathode comprises Al:
the interlayer comprises $MoO_3$;
each of the first organic host materials comprises mCP;
each of the second organic host materials comprises CBP;
each of the first organic dopant materials comprises FIzIr; and
each of the second organic dopant materials comprises Ir(ppy)₃, PQIr, or both.

18. The device of claim 1, wherein the device emits white light having a CRI of at least 75.

19. The device of claim 18, wherein the exciton blocking layer comprises Ir(ppz)₃.

* * * * *